United States Patent
Orimoto et al.

(10) Patent No.: US 7,736,973 B2
(45) Date of Patent: Jun. 15, 2010

(54) NON-VOLATILE MEMORY ARRAYS HAVING DUAL CONTROL GATE CELL STRUCTURES AND A THICK CONTROL GATE DIELECTRIC AND METHODS OF FORMING

(75) Inventors: Takashi Orimoto, Sunnyvale, CA (US); George Matamis, San Jose, CA (US); James Kai, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 18 days.

(21) Appl. No.: 12/020,428

(22) Filed: Jan. 25, 2008

(65) Prior Publication Data

US 2009/0189211 A1    Jul. 30, 2009

(51) Int. Cl.
*H01L 21/3205* (2006.01)
(52) U.S. Cl. .............. 438/257; 438/593; 257/E21.68; 257/E21.681
(58) Field of Classification Search ............ 257/21.422, 257/365, 185, 2, 102, 182, E21.422, E21.209, 257/E21.69, 319, E21.68, E21.681; 365/185.01, 365/185.02, 185.03, 185.11, 185.24, 202; 438/238, 257, 211, 592, 593; 714/123; 711/E12.008, 711/E12.019, E12.02
See application file for complete search history.

(56) References Cited

U.S. PATENT DOCUMENTS

| | | | |
|---|---|---|---|
| 5,459,091 A | 10/1995 | Hwang | |
| 6,040,220 A | 3/2000 | Gardner et al. | |
| 6,066,534 A | 5/2000 | Son | |
| 6,746,920 B1 | 6/2004 | Wen et al. | |
| 6,888,755 B2 | 5/2005 | Harari | |
| 7,026,684 B2 | 4/2006 | Sakuma et al. | |
| 2006/0286749 A1 | 12/2006 | Tseng et al. | |
| 2007/0128787 A1 | 6/2007 | Higashitani | |

(Continued)

OTHER PUBLICATIONS

Chan, et al., "A True Single Transistor Oxide-Nitride-Oxide EEPROM Device," IEEE Electron Device Letters, vol. EDL-8, No. 3, Mar. 1987, pp. 93-95.

(Continued)

*Primary Examiner*—Thomas L Dickey
*Assistant Examiner*—Nikolay Yushin
(74) *Attorney, Agent, or Firm*—Vierra Magen Marcus & DeNiro LLP

(57) ABSTRACT

Non-volatile semiconductor memory devices with dual control gate memory cells and methods of forming are provided. A charge storage layer is etched into strips extending across a substrate surface in a row direction with a tunnel dielectric layer therebetween. The resulting strips may be continuous in the row direction or may comprise individual charge storage regions if already divided along their length in the row direction. A second layer of dielectric material is formed along the sidewalls of the strips and over the tunnel dielectric layer in the spaces therebetween. The second layer is etched into regions overlaying the tunnel dielectric layer in the spaces between strips. An intermediate dielectric layer is formed along exposed portions of the sidewalls of the strips and over the second dielectric layer in the spaces therebetween. A layer of control gate material is deposited in the spaces between strips. The resulting control gates are separated from the strips by the intermediate dielectric layer and from the substrate surface by the tunnel dielectric layer, the second layer of dielectric material and the intermediate dielectric layer.

21 Claims, 18 Drawing Sheets

U.S. PATENT DOCUMENTS

2007/0243680 A1  10/2007  Harari et al.

OTHER PUBLICATIONS

Nozaki, et al., "A 1-MbEEPROM with MONOS Memory Cell for Semiconductor Disk Application," Journal of Solid State Circuits, vol. 26, No. 4, Apr. 1991 IEEE, pp. 497-501.

Choi, Yang-Kyu, et al., "Sublithographic nanofabrication technology for nanocatalysts and DNA chips," J.Vac. Sci. Technol. B 21(6), American Vacuum Society, Nov./Dec. 2003, pp. 2951-2955.

U.S. Appl. No. 11/623,314, filed Jan. 15, 2007.
U.S. Appl. No. 11/623,315, filed Jan. 15, 2007.
U.S. Appl. No. 11/765,866, filed Jun. 20, 2007.
U.S. Appl. No. 12/014,689, filed Jan. 15, 2008.

(y-direction)

(x-direction)

(x-direction)

(y-direction)

(x-direction)

(x-direction)

(x-direction)

(x-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(y-direction)

(x-direction)

(x-direction)

(x-direction)

(y-direction)

(y-direction)

(y-direction)

(y-direction)

NON-VOLATILE MEMORY ARRAYS HAVING DUAL CONTROL GATE CELL STRUCTURES AND A THICK CONTROL GATE DIELECTRIC AND METHODS OF FORMING

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

Memory cells of typical non-volatile flash arrays are divided into discrete blocks of cells that are erased together. That is, the block contains the minimum number of cells that are separately erasable together as an erase unit, although more than one block may be erased in a single erase operation. Additionally, more recent memories may provide erasing in smaller units than blocks. Each block typically stores one or more pages of data, where a page includes the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in which it is stored.

As demands for higher densities in integrated circuit applications have increased, fabrication processes have evolved to reduce the minimum feature sizes of circuit elements such as the gate and channel regions of transistors. As the feature sizes have decreased, modifications to the traditional NAND memory array have been made to, among other things, decrease parasitic capacitances associated with small feature sizes. U.S. Pat. No. 6,888,755, entitled "Flash Memory Cell Arrays Having Dual Control Gates Per Memory Cell Charge Storage Element," by Eliyahou Harari, incorporated herein by reference, describes a memory array with a dual control gate structure. U.S. Pat. No. 7,026,684, entitled "Nonvolatile Semiconductor Memory Device," by Sakuma, et al., incorporated herein by reference, describes a memory with an inverted-T type floating gate structure. The charge storage element is divided into two regions having different dimensions. Fabricating the components of these devices at the specified feature sizes poses numerous demands on the fabrication processes.

SUMMARY OF THE INVENTION

High density semiconductor devices and methods of fabricating the same are provided in accordance with one or embodiments.

Non-volatile semiconductor memory with dual control gate memory cells and methods of forming the same are provided in accordance with embodiments. A charge storage layer is etched into strips extending across a substrate surface in a row direction with a tunnel dielectric layer therebetween. The resulting strips may be continuous in the row direction or may comprise individual charge storage regions if already divided along their length in the row direction. A second layer of dielectric material is formed along the sidewalls of the strips and over the tunnel dielectric layer in the spaces therebetween. The second layer is etched into regions overlaying the tunnel dielectric layer in the spaces between strips. An intermediate dielectric layer is formed along exposed portions of the sidewalls of the strips and over the second dielectric layer in the spaces therebetween. A layer of control gate material is deposited in the spaces between strips. The resulting control gates are separated from the strips by the intermediate dielectric layer and from the substrate surface of the substrate by the tunnel dielectric layer, the second layer of dielectric material and the intermediate dielectric layer.

A method of making a non-volatile memory according to one embodiment includes forming a first layer of dielectric material over a surface of a substrate, forming a first set of strips of conductive material elongated in a first direction over the surface of the substrate with the first layer of dielectric material therebetween and separated in a second direction with spaces therebetween. The first set of strips include strips with sidewalls extending a first length above the first dielectric layer in a third direction substantially perpendicular to the surface of the substrate. The first direction is substantially perpendicular to the second direction and the third direction. In the spaces between the first set of strips of conductive material is formed a first set of strips of dielectric material elongated in the first direction and extending in the third direction along the sidewalls of the first set of strips a second length above the first layer of dielectric material. The second length being substantially less than the first length such that a substantial portion of the sidewalls of the first set of strips of conductive material remain exposed. A second layer of dielectric material is formed along the exposed portions of the sidewalls of the first set of strips of conductive material and over the first set of strips of dielectric material. A second set of strips of conductive material is formed including strips elongated in the first direction and at least partially occupying the spaces between the first set of strips of conductive material in the second direction, the second set of strips being separated from the first set of strips of conductive material by the second layer of dielectric material and being separated from the surface of the substrate by the first layer of dielectric material, the first set of strips of dielectric material and the second layer of dielectric material.

A non-volatile memory in accordance with one embodiment is formed using a substrate having a surface extending in first and second substantially perpendicular directions with a third direction being substantially perpendicular to the surface of the substrate. A first layer of dielectric material is formed over at least a first portion of the surface of the substrate. The memory includes a first set of charge storage regions having sidewalls elongated in the first direction over the first portion of the substrate surface. The first set of charge storage regions are separated from the substrate surface by the first layer of dielectric material and are separated from one another in the second direction with spaces therebetween. A first set of dielectric regions includes regions elongated in the first direction and extending in the third direction along a first portion of each sidewall of the first set of charge storage regions. A second layer of dielectric material is elongated in the first direction over the first set of dielectric regions and extends in the third direction along a second portion of each sidewall of the first set of charge storage regions. A first set of control gates includes gates elongated in the first direction and at least partially occupying the spaces between the first set of charge storage structures in the second direction. The first set of control gates is separated from the first set of charge storage structures by the second layer of dielectric material and is separated from the surface of the substrate by the first layer of dielectric material, the first set of dielectric regions and the second layer of dielectric material.

Other features, aspects, and objects of the disclosed technology can be obtained from a review of the specification, the figures, and the claims.

DETAILED DESCRIPTION

Figure 1:
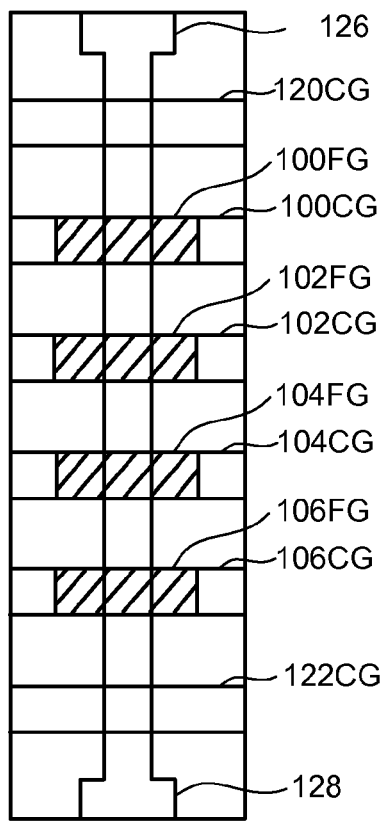
FIG. 1 is a top view of a NAND string.
Figure 2:
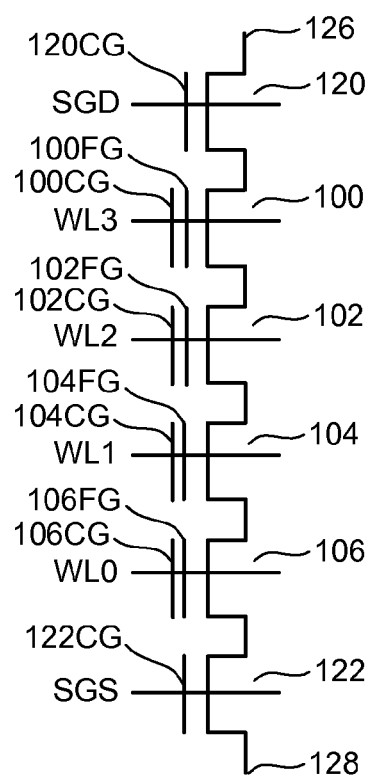
FIG. 2 is an equivalent circuit diagram of the NAND string depicted in FIG. 1.
Figure 3:
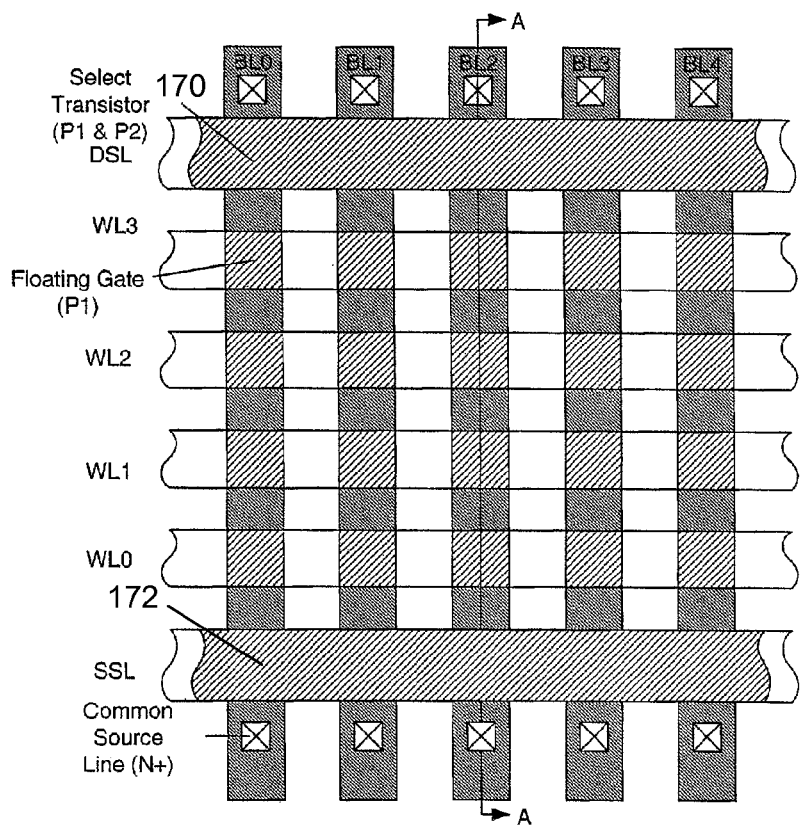
FIG. 3 is a plan view of a portion of a NAND flash memory array.
Figure 4:
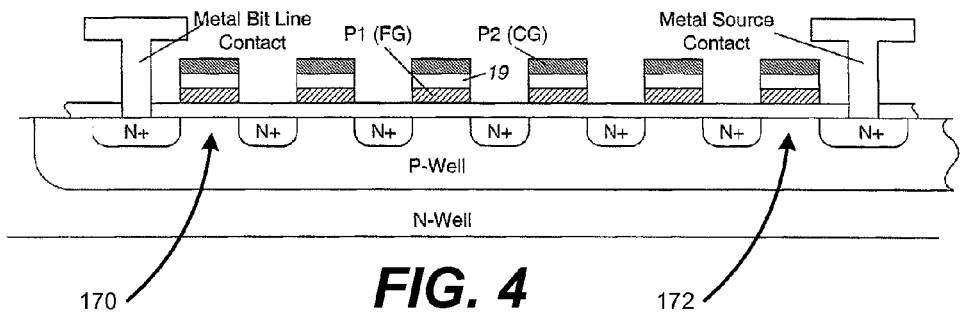
FIG. 4 is an orthogonal cross-sectional view taken along line A-A of the portion of the flash memory array depicted in FIG. 4.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. The floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
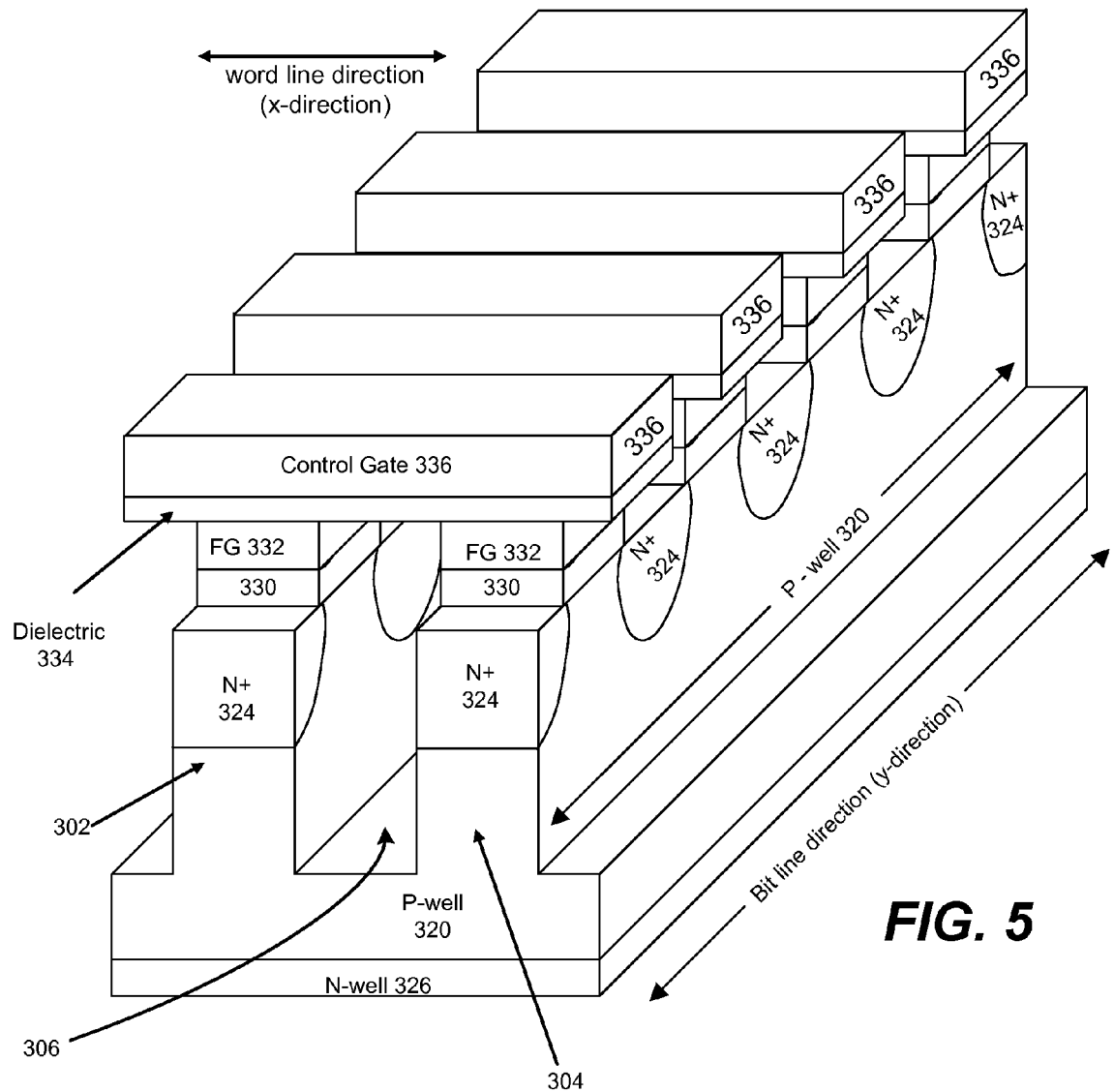
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Figure 6:
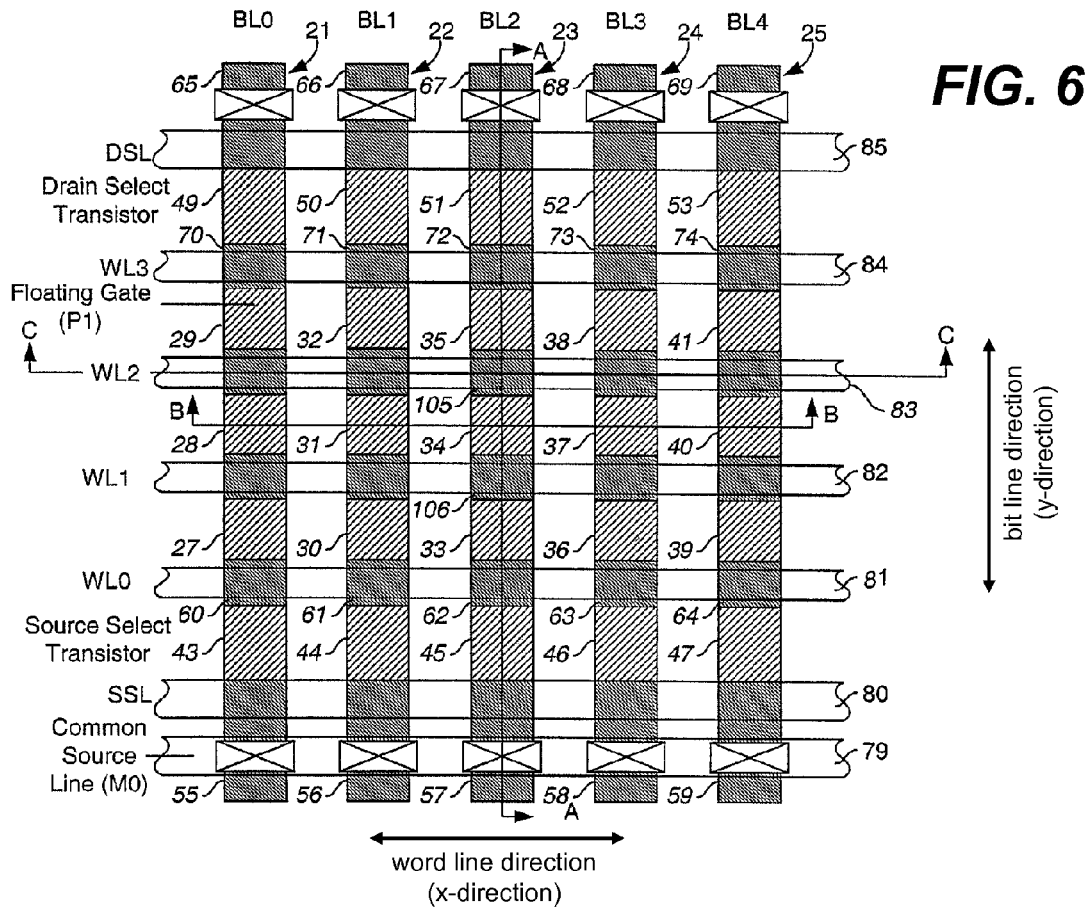
FIG. 6 is a plan view of a portion of a NAND flash memory array having a dual control-gate structure.

A NAND memory array having two control gates per memory cell is illustrated in plan view in FIG. 6. Five NAND strings 21-25 of series connected memory cells are included, with three floating gates or charge storage elements shown in each string. String 21 includes floating gates 27, 28, 29, string 22 includes floating gates 30, 31, 32, string 23 includes floating gates 33, 34, 35, string 24 includes floating gates 36, 37, 38, and string 25 includes floating gates 39, 40, and 41. Only a small rectangular array of fifteen memory cells is illustrated for ease of explanation. Actual implementations of such an array would typically include millions of such memory cells forming thousands of NAND strings, each string normally having 16, 32 or more memory cells.

Each NAND string includes two select transistors, one at each end of the string, to controllably connect the string between a different one of global bit lines BL0-BL4 and a common source line. A voltage is applied to respective source select gates 43-47 to control connection of one end of their respective memory cell strings 21-25 to the common source line. The other ends of the strings 21-25 are connected through respective drain select transistors 49-53 to the respective bit lines BL0-BL4. Column control circuitry applies a voltage to each bit line that is representative of the specific data to be written, or to sense the voltage or current of a corresponding string or memory cell during a read or verify operation. The select transistors include respective source and drain regions 55-64 and 65-74 in a semiconductor substrate.

Control gate (word) lines 81-84 are positioned between the floating gates instead of on top of them as in traditional NAND memory arrays. Each control gate line extends across multiple strings of memory cells and is capacitively coupled through a suitable insulating dielectric, such as multi-layer oxide-nitride-oxide (ONO), to the floating gates on both sides. Additional coupling area is obtained by using the sidewall areas of both sides of the floating gates. The floating gates can be made thicker (higher) than usual in order to increase this coupling area, and the control gates in between them are then made to be at least as thick as the floating gates in order to take advantage of the added coupling area. An advantage is that this coupling area may be controlled largely independent of the coupling area of the floating gates and the substrate, resulting in a desirably high coupling ratio even as the coupling area of the floating gates with the substrate is reduced during decreases in device dimensions. The principles, devices and techniques disclosed hereinafter can be used with traditional NAND architectures having word lines positioned above floating gates, or architectures having word lines between the floating gates as shown in FIG. 6.

Two control gate or word lines replace a single word line of conventional NAND arrays in FIG. 6. For example, the word line that would extend across the row of floating gates 27, 30, 33, 36 and 39 in a conventional array is replaced by two control gate lines 81 and 82 (WL0 and WL1). Similarly, a word line that would normally extend across the row of floating gates 28, 31, 34, 37 and 40 is replaced by two control gate lines 82 and 83 (WL1 and WL2). The control lines 81-84 are elongated in the x-direction across the array and separated in the y-direction by the length of the intervening floating gates and the thicknesses of the dielectric layers between them. Although the size of the memory floating gate is typically made as small as the photolithography allows in both x and y dimensions, the channel length of the select transistors 43-47 and 49-53 (y-dimension) is typically slightly larger than the minimum feature size to ensure it can effectively block all conduction including leakage when the maximum voltage is applied across it.

Figure 7:
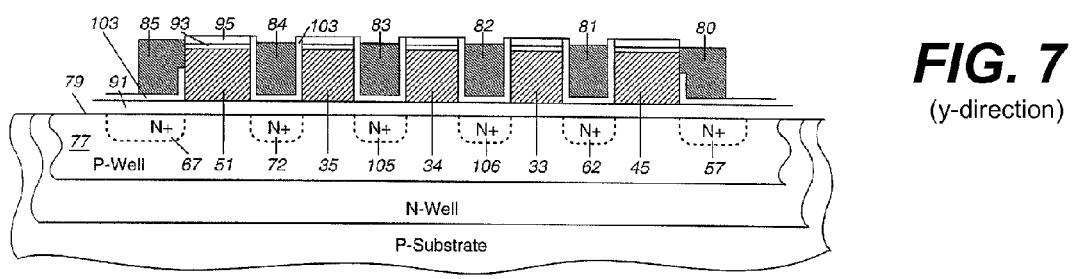
FIG. 7 is an orthogonal cross-sectional view taken along line A-A of the portion of the flash memory array depicted in FIG. 6.
Figure 8:
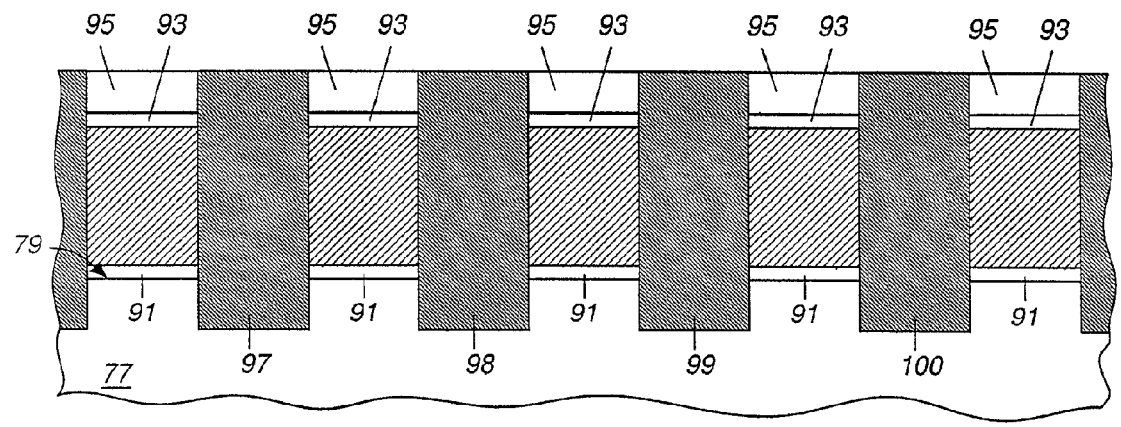
FIG. 8 is an orthogonal cross-sectional view taken along line B-B of the portion of the flash memory array depicted in FIG. 6.
Figure 9:
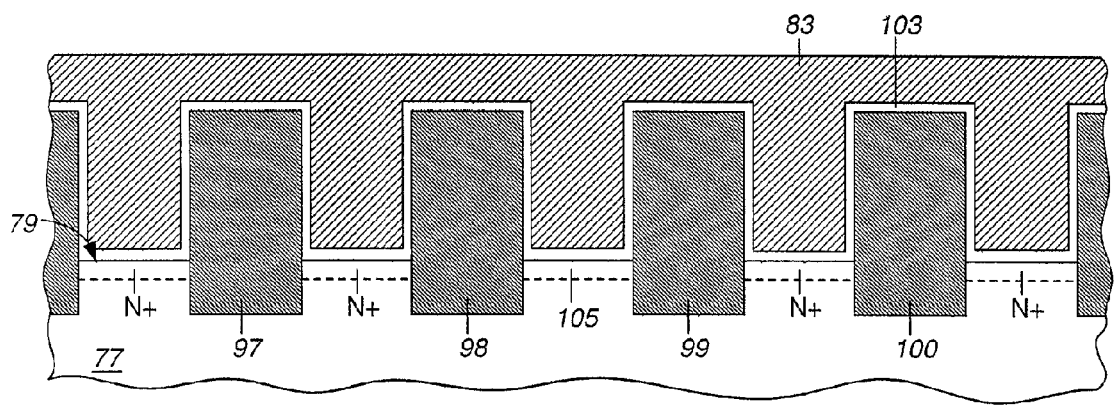
FIG. 9 is an orthogonal cross-sectional view taken along line C-C of the portion of the flash memory array depicted in FIG. 6.

FIG. 7 is an orthogonal cross-sectional view of the array shown in FIG. 6 taken along line A-A in the y-direction through one string of memory cells. FIG. 8 is an orthogonal cross-sectional view of the array taken along line B-B in the x-direction along a row of memory cells extending across multiple strings. FIG. 9 is a cross-sectional view of the array taken along line C-C in the x-direction along a word line. A layer 91 of tunnel dielectric (e.g., silicon oxide, $SiO_2$) is formed on the surface 79 of the substrate 77 to a thickness of about 8 nm. A first layer of the charge storage material (e.g., doped polysilicon) is formed over at least the area of the array from which the floating gates 51, 35, 34, 33 and 45 are formed.

Electrical isolation is provided between columns of floating gates by Shallow Trench Isolation (STI). The exposed substrate surface is anisotropically etched to form trenches 97-100 elongated in the y-direction and positioned between the polysilicon/dielectric stack strips in the x-direction. These trenches are etched to a depth of 100-300 nm in one embodiment. In other embodiments, trench depths of up to 1000 nm, 2000 nm or more can be used.

Additional trenches can be formed alongside the first polysilicon strips with lengths in the x-direction. Over the active regions these trenches extend the full height of the floating gate plus the thickness of masking layers 93 and 95, and over the field regions they will extend 100-200 nm. The control gate lines 81-84, select gate lines 80 and 85, and source and bit line contacts are formed in these trenches. Before forming these control gate lines, ions are implanted in the trenches, shown in the cross-sectional view of FIG. 7 as memory transistor and select gate implanted source and drain regions 67, 72, 105, 106, 62 and 57. A dielectric layer 103 is formed over the exposed surfaces of the structure, conforming to the sidewalls and bottom surfaces of the newly formed trenches. The layer 103 is ONO but may also be a material having a higher dielectric constant.

A second layer of doped polysilicon is deposited over the array area, completely filling the trenches and contacting the dielectric layer 103. This polysilicon is then removed from the top of the structure by CMP, resulting in control gate lines 81-84, the SSL line 80, and the DSL line 85. These lines are made to extend at least as high as the floating gates to which they are capacitively coupled through the dielectric layer 103.

A thin dielectric separating the control gates from the surface of the substrate in dual control gate structures can lead to reliability issues induced by high electrical fields in this area. The bottom corners of the control gates may exacerbate these reliability issues. One solution is to increase the thickness of the dielectric separating the control gates and substrate surface. Increasing the thickness of the tunnel dielectric material can have undesired effects on operation of the charge storage structures. Increasing the thickness of the intermediate dielectric layer may decrease the influence of the control gates on the charge storage islands, degrading the corresponding coupling ratio.

Figure 10:
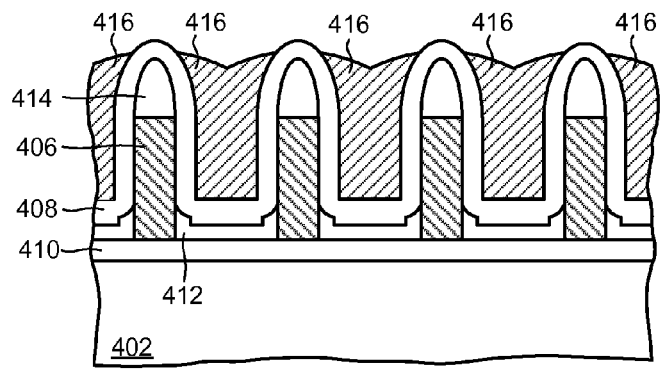
FIG. 10 is an orthogonal cross-sectional view through a portion of a NAND string of flash memory cells in accordance with one embodiment.

FIG. 10 is an orthogonal cross-sectional view through a column of memory cells of a NAND memory array in accordance with one embodiment of the presently disclosed technology. A first layer 410 of dielectric material, often referred to as a tunnel oxide because of the tunneling electron phenomenon and the frequent use of oxide, is formed over substrate 402. The tunnel dielectric layer extends in the column direction with a thickness in the direction vertical to the surface of the substrate. The charge storage regions 406, which can be conductive floating gates or some other suitable storage region, are aligned over the tunnel dielectric with spaces between floating gates adjacent in the column direction. Hard masks 414 overlie the upper surfaces of the floating gates. The array is a dual control gate structure, having control gates 416 positioned between adjacent floating gates and separated from the sidewalls thereof by an intermediate dielectric film 408. The intermediate dielectric film is often referred to as an inter-poly dielectric film or layer (IPD) because of its relation between the polysilicon floating and control gates. Often the intermediate dielectric is formed from more than one layer, frequently comprising a triple layer of oxide-nitride-oxide (ONO). Use of the term layer in the present disclosure should not be taken in a limiting sense to mean a single layer of material as for instance, the term intermediate dielectric layer is often referred to as a layer when in fact, multiple layers are used.

In the presently disclosed technology, an additional layer of dielectric material is formed over the tunnel dielectric layer between adjacent floating gates. This additional layer, which may be referred to as a control gate dielectric film or layer (CGD), is used to form dielectric regions 412 that extend in the column direction between adjacent floating gates with a thickness in the direction vertical to the surface of the substrate. The additional layer is formed to a limited depth so that regions 412 extend vertically with respect to the surface of the substrate along a portion of the sidewalls of the floating gates. These control gate dielectric regions increase the overall thickness of dielectric material between the lower surface of the control gates and the surface of the substrate, without a required increase in the thickness of the dielectric material separating the control gates from the sidewalls of the floating gates. This is beneficial for improvement in the reliability issues associated with a smaller thickness of dielectric material separating the control gates and the substrate surface, without adversely impacting the coupling ratio between the control gates and floating gates. The control gate dielectric can be formed of one or more layers of dielectric material and may also be formed along all or a portion of the sidewalls of the floating gates.

Figure 11:
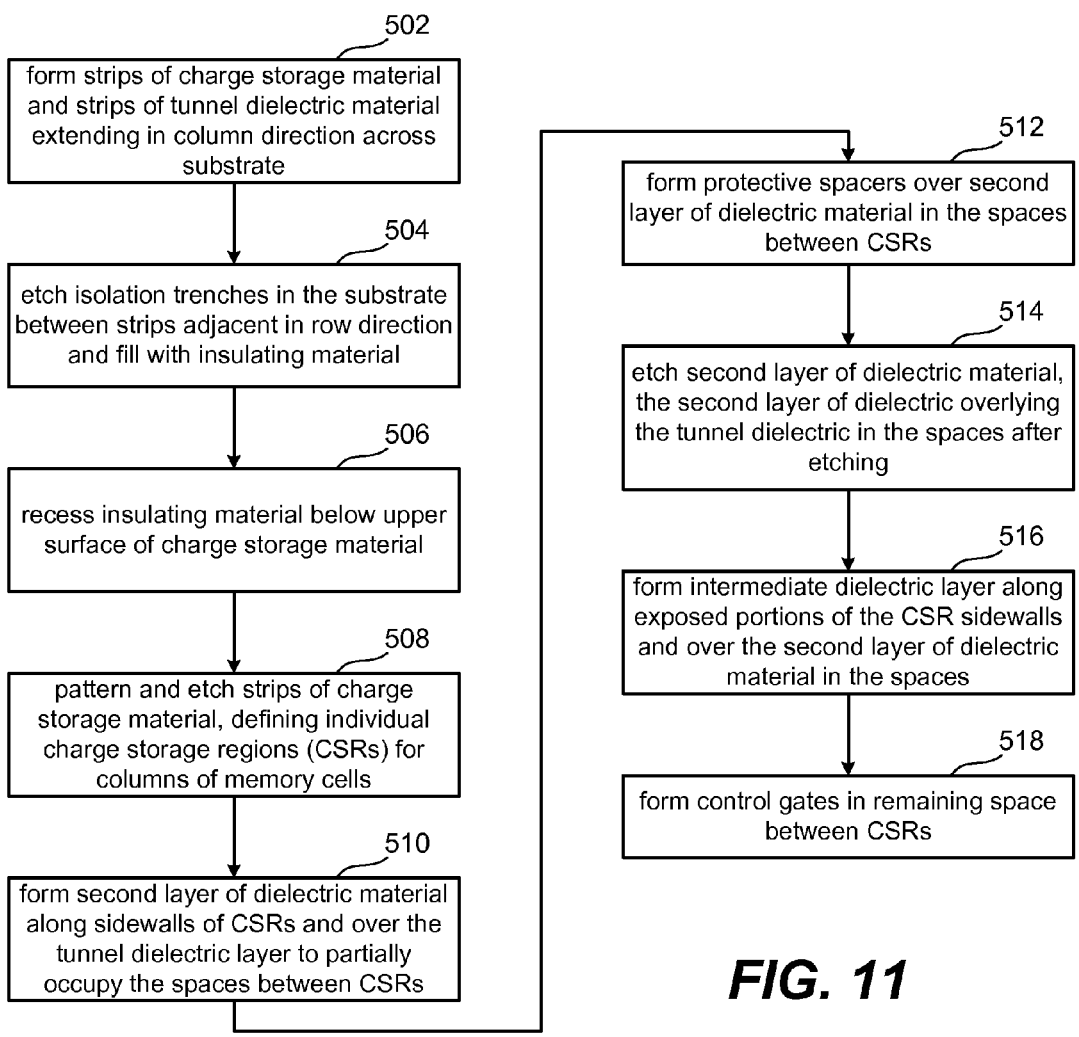
FIG. 11 is a flowchart describing a method of fabricating non-volatile flash memory in accordance with one embodiment.

FIG. 11 is a flowchart describing a method of fabricating a non-volatile memory array in accordance with one embodiment of the disclosed technology. At step 502, strips of charge storage material are formed over the surface of a substrate with strips of a tunnel dielectric material therebetween. One more layers of dielectric material can be deposited over the surface of the substrate, followed by one or more layers of charge storage material such as a conductive polysilicon floating gate material. The charge storage material is patterned, for example by forming strips of photoresist or strips of spacer material elongated in a first direction across the surface of the substrate. The first direction corresponds to the intended direction of the columns of series connected memory cells forming the NAND strings, which also corresponds to the bit line direction for the memory array. The layers are etched using the photoresist or spacer pattern as a mask to define strips of the charge storage material that are elongated in the column direction over strips of the tunnel dielectric layer.

At step 504, isolation is provided in a second direction between the resulting strips of the charge storage material. The second direction corresponds to the intended direction of rows of memory cells, also corresponding to the word line direction of the memory array which is substantially perpendicular to the bit line direction. The strips of charge storage material and tunnel dielectric material are used as a mask (often with one or more actual masking layers formed above) to etch the substrate surface therebetween, forming isolation trenches in the substrate that are elongated in the column direction between strips adjacent in the row direction. The trenches are filled with an insulating material such as silicon dioxide to provide electrical isolation between adjacent active areas in the substrate. After filling the trenches, the insulating material is recessed at step 506. The insulating material can be selectively etched to recess it below the upper surface of the charge storage layer. Recessing the insulating material facilitates the subsequent formation of control gates that will be continuous in the row direction. It is also possible to skip step 506 and later interconnect the discontinuous rows of control gates to form word lines.

The strips of charge storage material are patterned and etched at step 508 to form individual charge storage regions. A pattern comprised of strips of photoresist or spacers elongated in the row direction are formed over the charge storage material. The pattern applied at step 508 is substantially perpendicular to the pattern applied at step 502. Etching the charge storage material divides the strips along their length in the column direction, resulting in individual islands or regions of the charge storage material. Each strip is divided into a number of charge storage islands or regions that correspond to a resulting column of memory cells. Traditionally, polysilicon is used to form conductive floating gates.

At step 510, a second layer of dielectric material is formed over the array. The second dielectric layer is formed along the sidewalls of the charge storage regions, extending in the row direction, and over the tunnel dielectric layer between charge storage regions adjacent in the column direction. The second dielectric layer is formed to a limited depth, partially occupying the spaces between adjacent charge storage regions.

Protective spacers are formed over the second dielectric layer at step 512 to partially occupy the spaces between adjacent charge storage regions. The protective spacers extend in the column direction between the second dielectric layer that is formed along the sidewalls of adjacent charge storage regions. The protective spacers are formed to a limited depth such that portions of the second dielectric layer on the sidewalls of the charge storage regions above the protective spacers remain exposed. The spacers can be formed by depositing and etching a protective layer of nitride for example. Other materials can also be used, based on their selectivity with respect to the material chosen for the second dielectric material.

At step 514, the second layer of dielectric material is etched with the protective spacers masking the underlying portions thereof. Etching can be performed to remove all or substantially all of the exposed second dielectric layer on the sidewalls of the charge storage regions at a level above the protective spacers. In one embodiment, the second dielectric layer can be left on the sidewalls, but as mentioned, will affect the coupling ratio between floating and control gate. The portions of the second dielectric layer at a depth below the lower surface of the protective spacers will remain after etching. The remaining portions form dielectric regions that extend over the tunnel dielectric layer in the column direction between adjacent charge storage regions. These regions have a thickness such that the second dielectric material extends vertically along a portion of the sidewalls of the charge storage regions. The end result is an increased thickness of dielectric material overlying the substrate surface between charge storage regions. After etching the second layer of dielectric material, the protective spacers are removed.

At step 516, an intermediate dielectric layer is formed over the array. The intermediate dielectric layer, which is often (but not necessarily) a triple layer of oxide-nitride-oxide, can be deposited along the exposed portions of each charge storage region's sidewalls and over the second layer of dielectric material that extends between the charge storage regions. If some of the control gate dielectric is formed on the sidewalls, the intermediate dielectric layer is formed thereon. The intermediate dielectric layer partially occupies the spaces between adjacent charge storage regions, but does not completely fill the area. Spaces remain between portions of the second layer of dielectric material formed on opposing sidewalls of adjacent charge storage regions.

At step 518, control gates are formed in the remaining space between adjacent charge storage regions. The control gates can be formed by depositing a conductive material such as polysilicon in the spaces and selectively etching to recess the polysilicon and thereby form individual control gates. The control gates are elongated in the row direction, filling the spaces between adjacent charge storage regions. By previously recessing the trench insulating material, the control gates will be continuous in the row direction and intrinsically form word lines. As earlier described, the control gates between adjacent charge storage regions are shared by the two regions. In the column direction, each control gate is separated from the corresponding charge storage regions by the intermediate dielectric layer. Some portion of the second dielectric layer may be left on the sidewalls of the charge storage regions, which will then also separate the control gates from the charge storage regions. In the vertical direction (with respect to the substrate surface), the control gates are separated from the surface of the substrate by the tunnel dielectric layer, the second dielectric layer regions, and the intermediate dielectric layer. The regions formed from the second dielectric layer represent an increase in the thickness of the dielectric separating the control gates from the substrate surface compared with traditional dual control gate devices. By patterning and etching the second dielectric layer, the dielectric thickness separating the control gates and substrate surface is increased without requiring an increase in the thickness of the intermediate dielectric layer, particularly those portions that separate the control gates from the sidewalls of the charge storage regions.

Figure 12A:
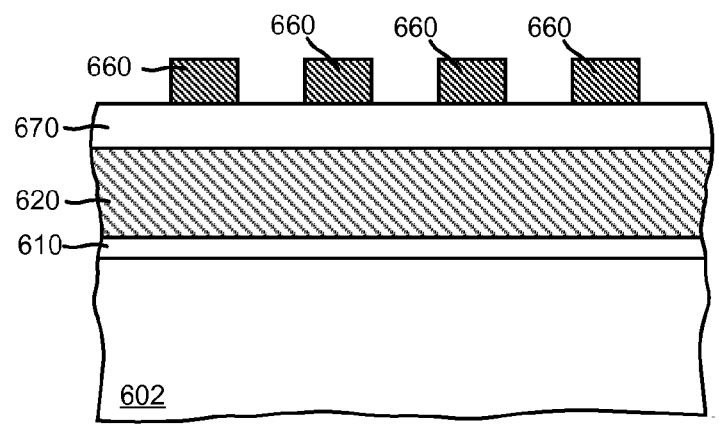
FIGS. 12A-12N are orthogonal cross-sectional views through a portion of a non-volatile memory array fabricated in accordance with one embodiment.
Figure 12B:
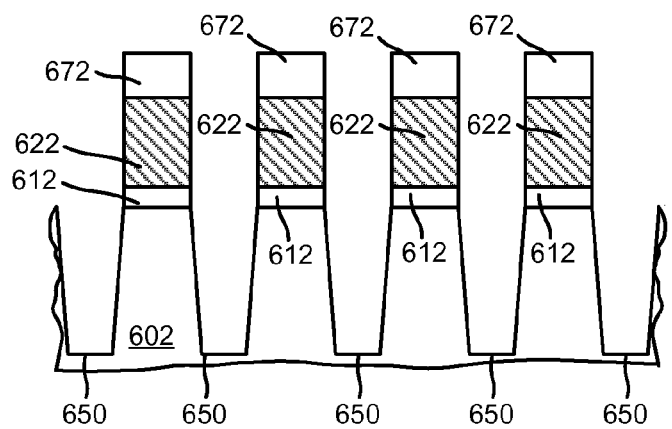
Figure 12C:
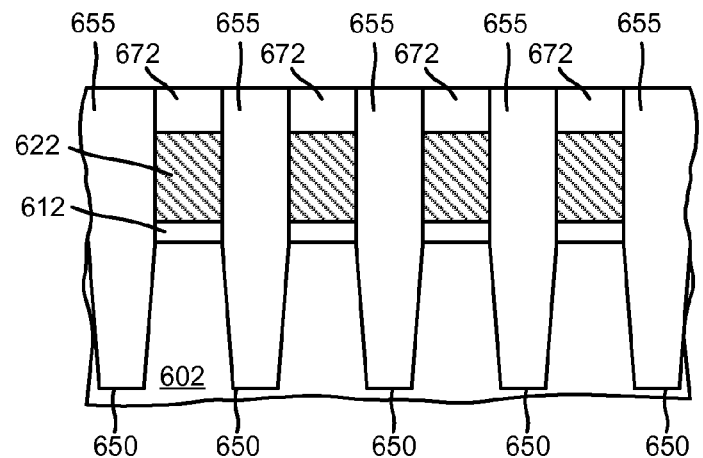
Figure 12D:
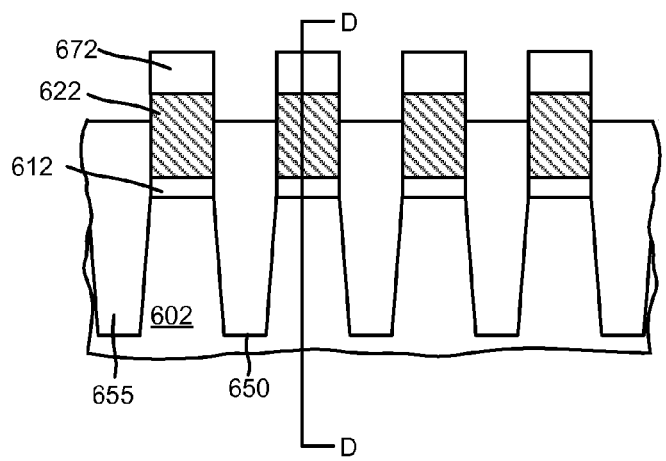
Figure 12E:
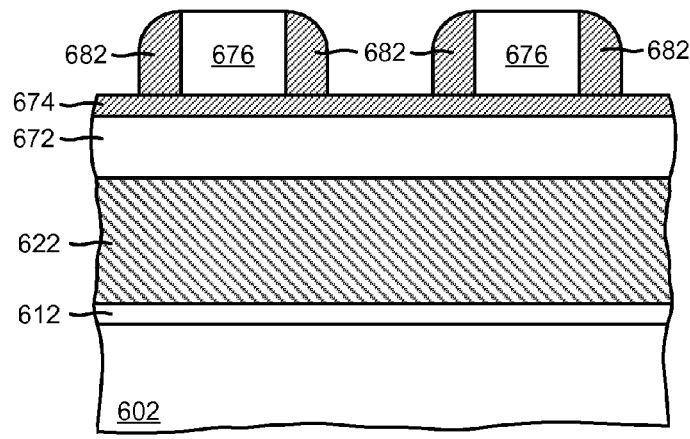
Figure 12F:
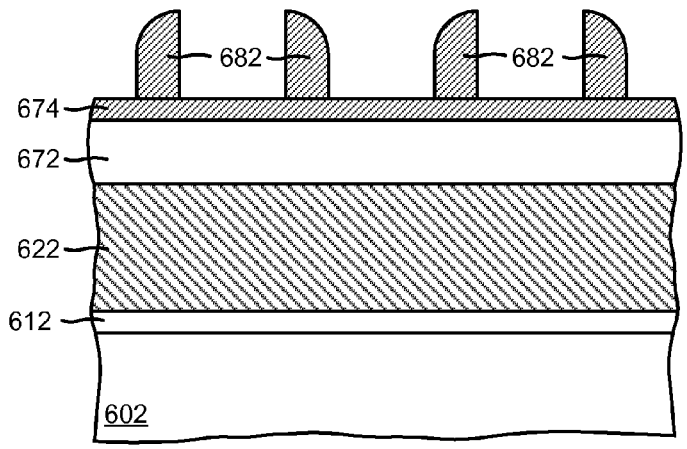
Figure 12G:
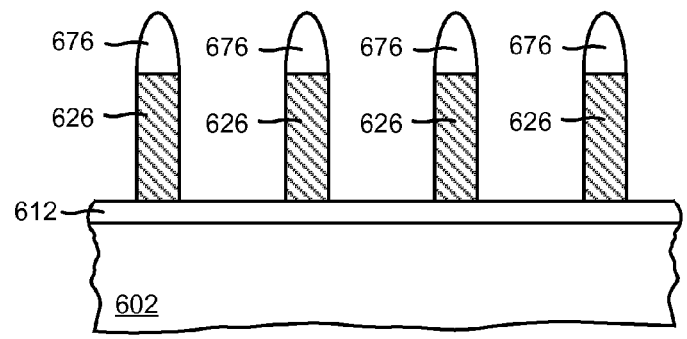
Figure 12H:
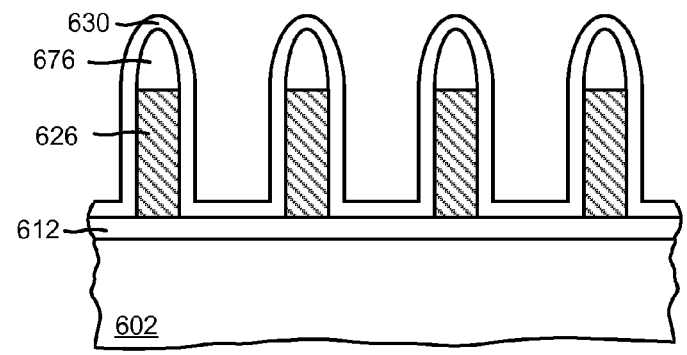
Figure 12I:
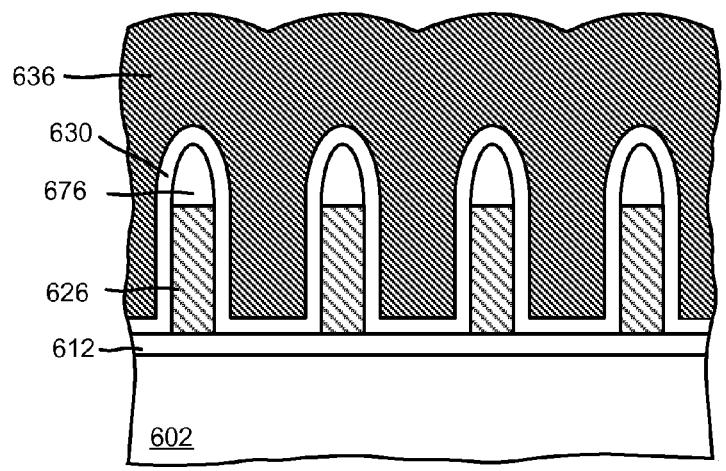
Figure 12J:
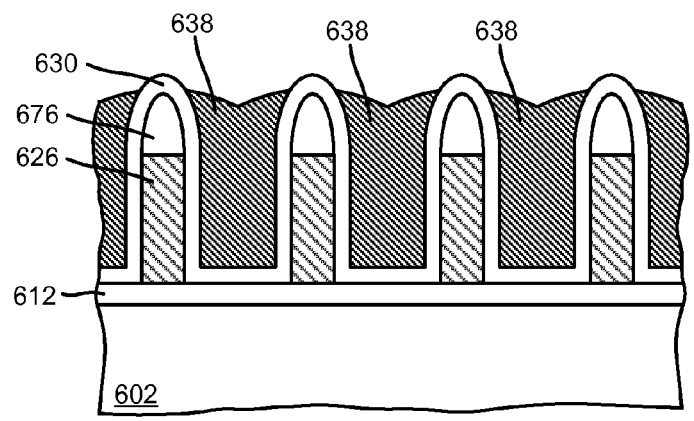
Figure 12K:
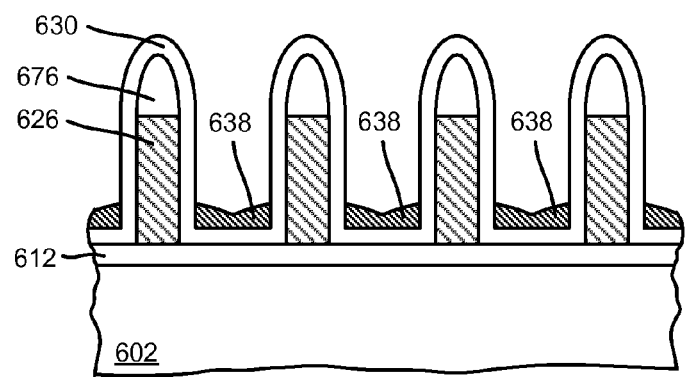
Figure 12L:
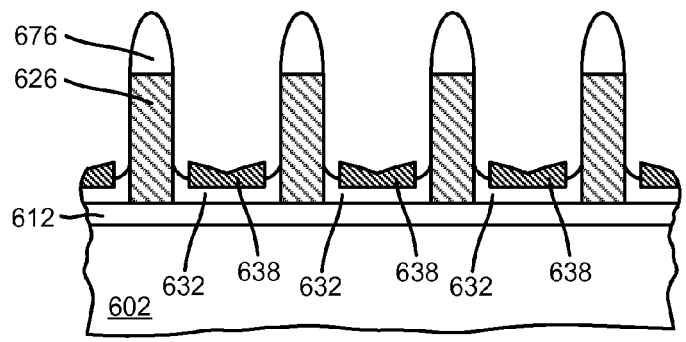
Figure 12M:
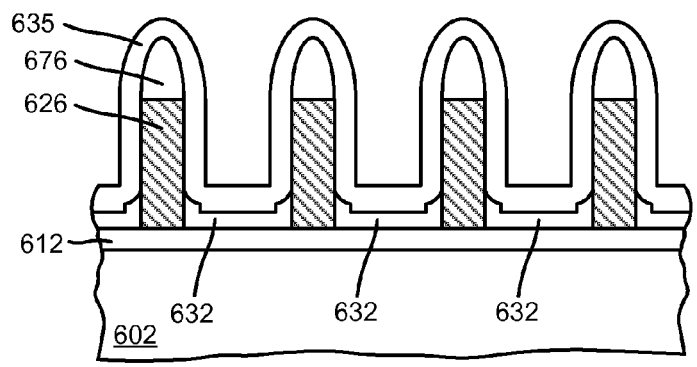
Figure 12N:
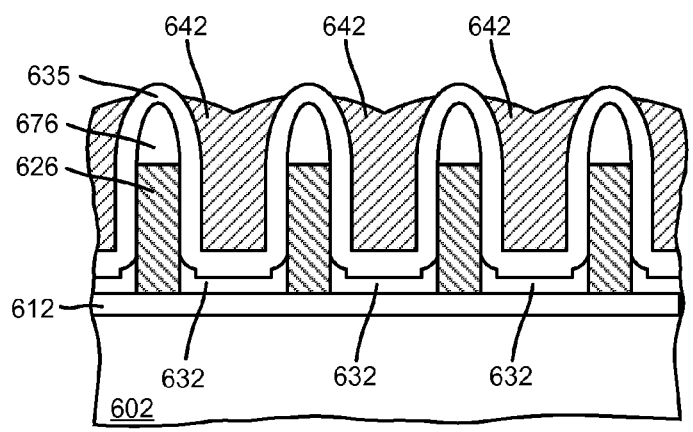

FIGS. 12A-12N are orthogonal cross-sectional views depicting a non-volatile memory array and method of forming the same in accordance with one embodiment of the presently described technology. The described embodiment is exemplary only and should not be taken as limiting the disclosure. The exact materials, dimensions and order of processing may vary according to the requirements of a particular implementation. The described embodiment includes a dual control gate structure for the memory cells, but it will be appreciated that the technology may be used with traditional NAND arrays, including those with composite charge storage structures.

FIG. 12A is a cross-sectional view taken along a line in the x-direction through a portion of a row of floating gates for the memory array, such as line D-D depicted in FIG. 6. In this embodiment, isolation trenches between active areas adjacent in the row direction are formed prior to etching the charge storage material to define the y-direction or gate dimension of the individual charge storage regions. One or more wells (e.g., a triple well), not shown, are typically formed in the substrate 602. The term substrate may include reference to such well regions. After implanting and associated annealing of the well(s) to dope the substrate, a tunnel oxide layer 610 is thermally grown over the substrate surface. The oxide can also be deposited using known chemical vapor deposition (CVD) processes, metal organic CVD processes, physical vapor deposition (PVD) processes, atomic layer deposition (ALD) processes, grown using a thermal oxidation process, or formed using other suitable processes. A zero layer formation step including the formation of a pad oxide layer for example, may precede formation of the tunnel dielectric layer in some embodiments.

A layer 620 of polysilicon or other charge storage material is formed over the tunnel oxide 610. It is noted that a layer may still be said to be over another layer when one or more interleaving layers are between the two layers, as well as when the two layers are in direct contact. In one embodiment, doped polysilicon is formed by low-pressure chemical vapor deposition (LPCVD), although other processes can be used. Different thicknesses of the charge storage layer can be used, for example, between about 5 nm and 200 nm in one embodiment. This thickness is greater than that of some NAND memories, with the result that the floating gates are thicker than those of some traditional devices.

A hard mask material 670 is formed over the charge storage layer. The hard mask can include different materials such as a layer of high temperature oxide (HTO). In one embodiment, the hard mask includes a thin pad of silicon dioxide over which is formed a layer of silicon nitride ($Si_3N_4$). Strips of photoresist 660 are patterned over the hard mask using conventional photolithography techniques. The strips of photoresist extend across the substrate in the column direction with spaces therebetween. Spacer-assisted patterning techniques or nano-imprint technologies can be used in place of the photoresist strips to form smaller features sizes in one embodiment.

FIG. 12B depicts the memory array after a series of processing steps to form active areas separated by electrical isolation regions. The hard mask 670 is etched using the photoresist pattern as a mask, followed by etching charge storage layer 620 and tunnel dielectric layer 610 using the hard mask. Anisotropic reactive ion etching is used to etch the layers stacked above the substrate into strips 622 of the charge storage layer 620 overlying strips 612 of the tunnel dielectric layer 610. Strips 672 of the hard mask layer overlie the strips of the charge storage material. Columns of memory cells will be formed from the strips which extend in the column direction across the substrate. After etching the stacked layers, the substrate is anisotropically etched to form trenches 650 elongated in the column direction and positioned between the strips in the row direction.

An insulating material 655 such as silicon dioxide is deposited to fill the trenches as depicted in FIG. 12C. The insulating material is polished to about the level of the upper surface of the strips 672 of the hard mask layer. Selective oxide etching is then performed to recess the insulating material below the upper surfaces of the strips 622 of the charge storage layer as depicted in FIG. 12D. The trench isolating material is recessed so that the subsequently formed control gates can extend continuously over the substrate in the row direction, without breaks at the isolation trenches.

After forming active areas extending in the column direction, a series of processes are performed to define memory cells from the individual columns or strips of the layer stack. FIG. 12E is an orthogonal cross-sectional view taken along line D-D of FIG. 12D. The sectional view shows one column or active area of the memory array depicted in FIG. 12E after forming the isolation trenches. A strip 622 of polysilicon overlies a strip 612 of the tunnel oxide, with a strip 672 of the hard mask overlying the strips of polysilicon. FIG. 12E also depicts the array after forming an optional assist layer 674 and sacrificial features 676. The assist layer will aid in subsequent spacer formation processes as described hereinafter. The sacrificial features can be formed by patterning strips of photoresist extending in the row direction over an oxide or other sacrificial layer and anisotropically etching to form a set of sacrificial features that extend across the substrate in the row direction with spacing therebetween in the column direction. Polysilicon pacers 682 are formed along the sidewalls of the sacrificial features. Conformal processes can be used to deposit a layer of polysilicon which is etched back to form the spacers. Nonconformal processes can also be used. After forming the spacers, the sacrificial features are removed using a chemical wet etch to strip the oxide material, resulting in spacers with spaces therebetween in the column direction as depicted in FIG. 12F.

The assist layer 674 serves a number of functions in the spacer-formation process. First, the assist layer can provide an etch stop for the wet etch process used to strip the sacrificial features. The assist layer can also provide a stable base for the subsequently formed spacers. For example, the material composition of the assist layer 674 is chosen to provide adequate adhesion for the thinly formed spacers. A matched material composition for the spacers and assist layer facilitates adhesion between the spacers and the underlying layer. For example, the assist layer and spacer material are both polysilicon in one embodiment to improve the stability of the spacers when the sacrificial features are removed. Similar materials that are not exactly the same may also be used to improve adhesion of the spacers to their base layer. Using similar materials for the spacers and intervening layer can also help with stresses between the different films. If layers of different materials are used, the different materials may have different coefficients of thermal expansion causing stress at the interface of the different materials. When the same or similar materials are used, matching thermal coefficients can decrease stresses at the material interfaces. More details regarding the use of an assist layer 426 can be found in U.S. patent application Ser. No. 11/623,314, entitled "Method Of Forming Spacer Patterns Using Assist Layer for High Density Semiconductor Devices," by Pham, et al., filed Jan. 15, 2007.

After stripping the sacrificial features, the spacers are used as a mask for etching the underlying layers as depicted in FIG. 12G. Chemically non-selective reactive ion etching is first used to etch through the assist layer and hard mask. After reaching the polysilicon, selective etching is used to etch the polysilicon until reaching the tunnel dielectric layer. Etching the strips of polysilicon divides them along their length in the column direction, thereby forming an array of isolated floating gates 626 or other charge storage region. The length of the spacers in the column direction defines the gate lengths of the resulting floating gates. Etching the strips 672 of the hard mask layer results in individual hard masks 674 formed over the upper surface of each floating gate 626.

FIG. 12H depicts the array after forming a second layer 630 of dielectric material over the substrate. The second layer is formed along the sidewalls of the of the charge storage regions and over the strips 612 of the tunnel dielectric layer, partially occupying the spaces between charge storage regions adjacent in the column direction. The second layer is HTO (SiO) deposited to a depth of about 100 nm in one embodiment, although other high-K materials including different oxides and other materials can also be used. A conformal process is used in one embodiment although this is not required.

A protective layer 636 of silicon nitride is deposited over the array to a depth of about 1200 nm as depicted in FIG. 12I. The protective layer is chosen based on its chemical selectivity with respect to the second layer of dielectric material. Other material combinations can be used. After depositing the protective layer, it is etched back to form protective spacers 638 depicted in FIG. 12J. Anisotropic reactive ion etching is used in one embodiment to form the spacers. After forming the spacers, a wet etch process is used to recess the protective spacers without damaging the hard mask, leaving a portion of the spaces open between floating gates as depicted in FIG. 12K.

After recessing the protective spacers, they are used as a mask for etching the second layer of dielectric material. FIG. 12L depicts the array after etching to remove the exposed portions of the second dielectric layer from between the floating gates. An isotropic HTO wet etch is used to selectively remove the second dielectric layer with respect to the protective spacers in one embodiment. Removing the second dielectric layer exposes a portion of the sidewalls of each floating gate. Some of the second dielectric layer can be left on the sidewalls in other embodiments, forming a part of the intermediate dielectric layer. Etching the second layer of dielectric material forms control gate dielectric regions 632 between adjacent floating gates. The regions extend in the column direction over the tunnel dielectric layer between opposing sidewalls of adjacent floating gates. The regions are formed to a depth such that they extend vertically from the tunnel dielectric layer (with respect to the substrate surface) along a portion of each floating gate's sidewalls. The remaining portion of each floating gate sidewall is exposed after etching the second layer of dielectric material. After etching the exposed portions of the second dielectric layer, a chemical wet etch is used to selectively remove the protective spacers between the floating gates. Other processes such as selective reactive ion etching can also be used.

An intermediate layer 635 of dielectric material is then formed as shown in FIG. 12M. The intermediate dielectric layer is triple-layered ONO in one embodiment, but other materials can also be used. Conformal processes can provide a substantially constant thickness of the intermediate dielectric relative to the upper surface and sidewalls of the floating gates. The intermediate dielectric layer is formed over the second layer of dielectric material between adjacent floating gates and also along the exposed portions of the floating gate sidewalls. The intermediate dielectric layer only partially occupies the spaces between floating gates, leaving remaining space therebetween.

A layer of polysilicon or other conductive material is next deposited over the array and etched back to form the individual control gates 642 depicted in FIG. 12N. The control gates fill or substantially fill the area between adjacent portions of the intermediate ONO layer. The polysilicon layer is formed along the substantially vertical sidewalls of the intermediate ONO. The control gates are continuous in the row direction as a result of recessing the insulating material in the isolation trenches.

The resulting control gates are separated from the sidewalls of the adjacent floating gates by the intermediate dielectric layer, having a thickness defined by the depth of the corresponding deposition process if a conformal process is used. The control gates are separated from the surface of the substrate by the intermediate dielectric layer and the tunnel dielectric layer. Additionally, the second layer of dielectric material is formed between the surface of the substrate and the control gates, further insulating the control gates from the surface of the substrate to improve reliability issues.

The control gates intrinsically form the word lines of the array in the embodiment depicted in FIG. 12N, although additional interconnections or supplementations can be made to reduce series resistance, for example. The periphery circuits and transistors can be formed after completing the array. The array is covered with a dielectric insulation layer and one or more layers of standard via/metallization (e.g., aluminum or copper interconnects) follows to provide electrical access to all bit lines, source lines, word lines and access transistors. These metallization layers can be used as local or global interconnects to reduce the resistivity of word lines that may become exceedingly narrow and therefore highly resistive across large memory arrays.

Figure 13:
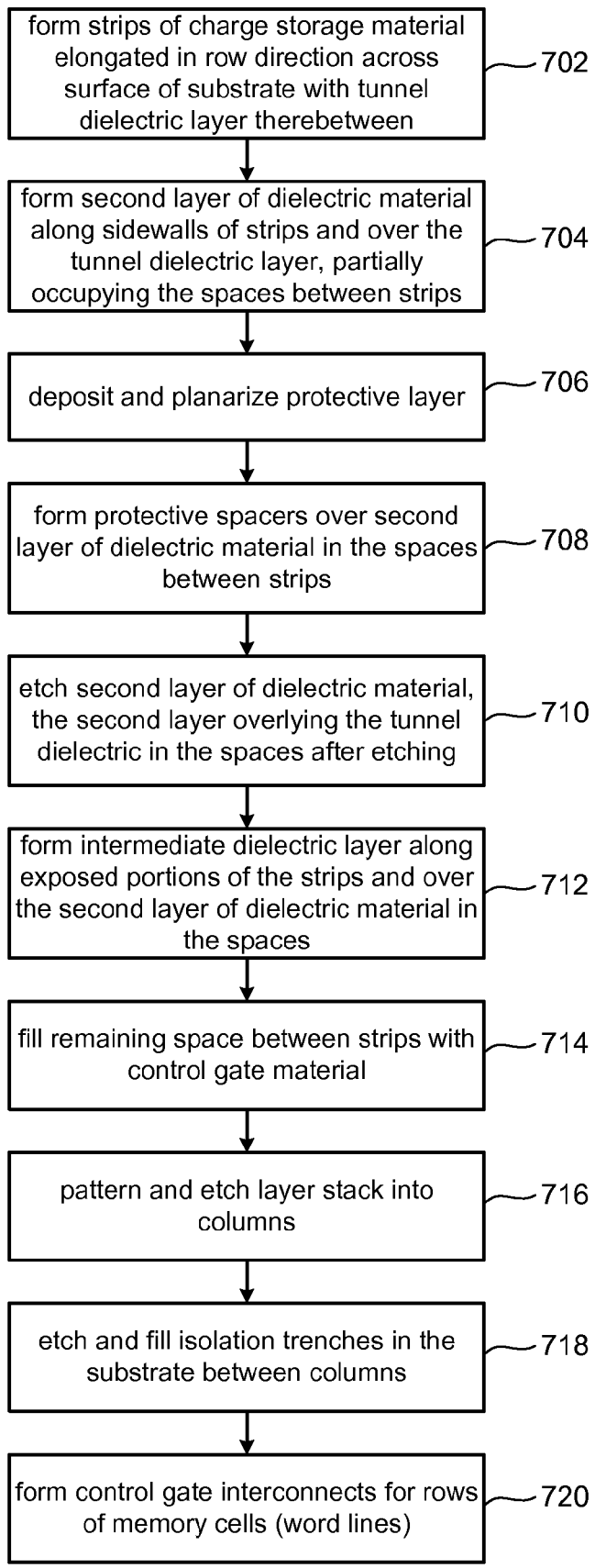
FIG. 13 is a flowchart describing a method of fabricating non-volatile flash memory in accordance with one embodiment.

FIG. 13 is a flowchart describing a method of non-volatile memory fabrication in accordance with another embodiment of the disclosed technology. Electrical isolation is provided after patterning and etching the charge storage material to form strips elongated in the row direction and after forming control gates between resulting strips adjacent in the column direction. FIG. 13 also adds an additional planarizing step when forming the protective spacers to increase the thickness of the dielectric over the substrate surface at an area beyond the memory array.

At step 702, a tunnel dielectric layer is formed over the surface of the substrate, followed by forming a layer of charge storage material. The charge storage material is patterned with strips of photoresist or spacers elongated in the row direction and etched to form strips elongated in the row direction across the substrate with the layer of tunnel dielectric material therebetween. Etching produces spaces between strips of the charge storage material that are adjacent in the column direction.

A second layer of dielectric material is formed at step 704. The second layer is deposited and extends in the row direction along the sidewalls of the strips of charge storage material. The second layer also partially fills the spaces between adjacent strips, extending between opposing sidewalls of adjacent strips over the tunnel dielectric layer.

A protective layer is deposited at step 706 and planarized by chemical mechanical polishing or another suitable method. The planarization is an additional process that reduces or eliminates differences in the depth of the protective layer prior to forming the protective spacers. The substrate may include areas set aside for devices other than the memory cells of the array, such as peripheral or other transistor areas. These areas may remain unpatterned during the previous processes and thus, will not include strips of the charge storage material as the memory array portion. Instead, these areas will have formed thereon continuous layers of the tunnel dielectric and second dielectric extending in the column direction. Because the charge storage material is removed from these areas, the protective layer may be formed to a greater depth and thickness at the memory array region.

After planarizing the protective layer, it is formed into protective spacers at step 708. The spacers are elongated in the row direction over the second dielectric layer between strips of the charge storage material. The protective spacers extend in the column direction between portions of the second dielectric layer formed on the sidewalls of the strips. The spacers extend vertically along a portion of the second dielectric layer. The spacers are formed to a limited thickness so that spaces will remain between strips of the charge storage material. At the substrate areas that have so far remained unpatterned, the protective layer will mask the underlying layers, extending continuously in these areas.

At step 710, the second dielectric layer is etched using the protective spacers as a mask. All or substantially all of the exposed second dielectric layer is removed from the sidewalls of the strips of charge storage material. The mask protects the underlying portions of the second dielectric material from etching. After etching, portions of the second dielectric layer remain, elongated in the row direction and extending over the tunnel dielectric layer in the column direction between adjacent strips of the charge storage material. These portions have a thickness such that they extend vertically along a portion of the sidewalls of the strips. The end result is an increased thickness of dielectric material overlying the substrate surface between the charge storage regions. After etching the second layer, the protective spacers are removed. At the unpatterned areas of the substrate, the protective layer protects the second layer of dielectric material from etching so that the tunnel dielectric and second dielectric layers remain. In the earlier described embodiment where the protective layer is not planarized, the protective layer may be completely removed when etching to define the protective spacers because of the smaller depth of the protective layer at those unpatterned areas.

The intermediate dielectric layer is formed at step 712. The intermediate dielectric layer is elongated in the row direction along the exposed portions of the sidewalls of the strips of charge storage material and over the second layer of dielectric material. The intermediate dielectric layer partially occupies the spaces between strips of the charge storage material that are adjacent in the row direction. A layer of oxide-nitride-oxide is deposited using a conformal process to form the dielectric in one embodiment. The remaining spaces between the adjacent strips of charge storage material are filled with the control gate material at step 714. A layer of doped polysilicon is deposited over the array and etched back to form individual control gates between the adjacent strips. The control gates are elongated in the row direction between adjacent strips of the charge storage material. The gates are separated from the sidewalls of the strips of charge storage material by at least the intermediate dielectric layer. The lower surface of the control gates is separated from the surface of the substrate by the intermediate dielectric layer, the second layer of dielectric material and the tunnel dielectric layer.

At step 716, the layer stack is formed into columns. The layer stack can be patterned and etched using traditional photoresist patterning or spacer-assisted patterning. A pattern of strips or spacers elongated in the column direction with spacing therebetween in the row direction are formed over the array, generally after applying one or more masking and/or assist layers. The layers are etched using the mask to form stacks elongated in the column direction. At step 718, using the stacks as a mask, the substrate is etched to form isolation trenches elongated in the column direction between columns of memory cells adjacent in the row direction. The trenches are filled with an insulating material such as silicon dioxide or another suitable dielectric to isolate the adjacent columns. By etching the layer stack and substrate, individual active areas are formed, including columns of the etched layers and portions of the underlying substrate.

Etching the layer stack and substrate to form isolated active areas after patterning and etching the control gates divides the control gates along their length in the row direction, forming individual control gates discontinuous in the row direction. At step 720, interconnects are formed for rows of control gates to provide continuity along which common signals can be applied to rows of control gates. The interconnections form the word lines for the array of memory cells.

Figure 14A:
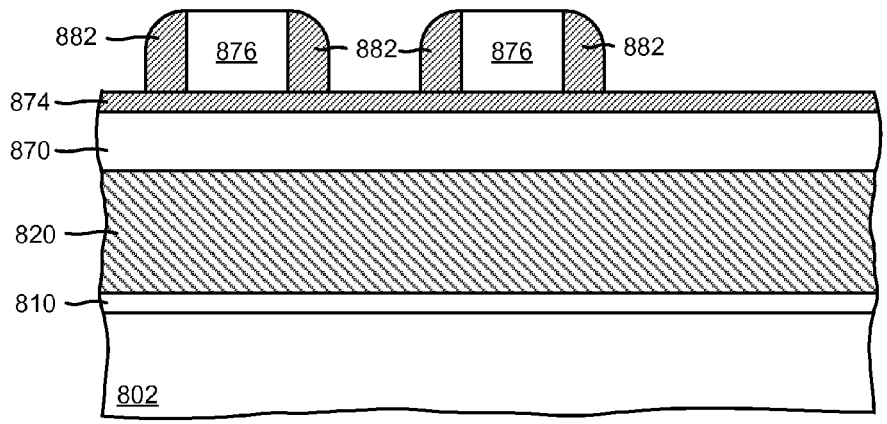
FIGS. 14A-14N are orthogonal cross-sectional views through a portion of a non-volatile memory array fabricated in accordance with one embodiment.
Figure 14B:
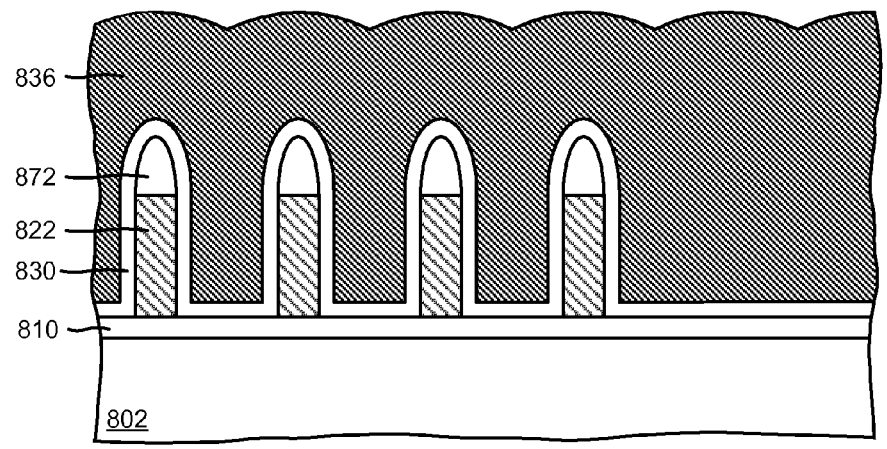
Figure 14C:
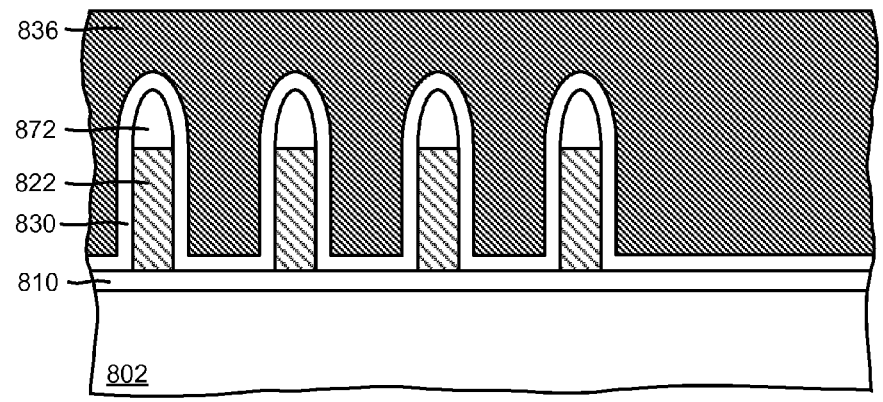
Figure 14D:
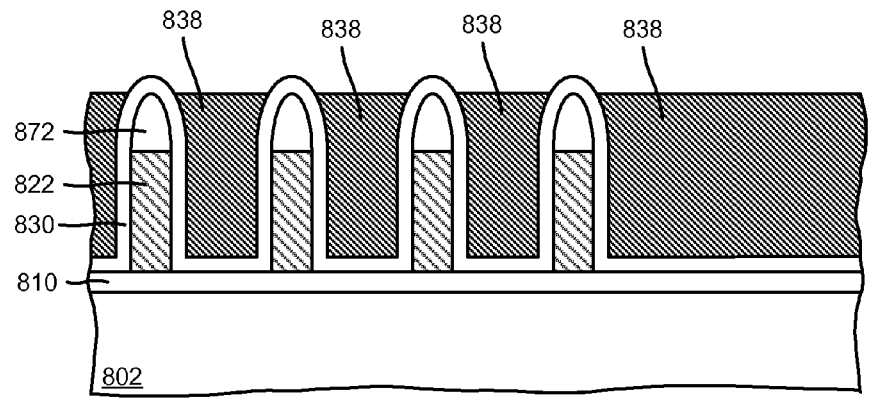
Figure 14E:
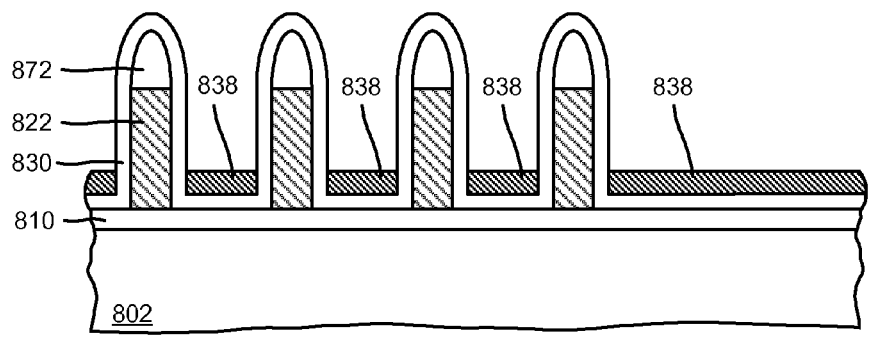
Figure 14F:
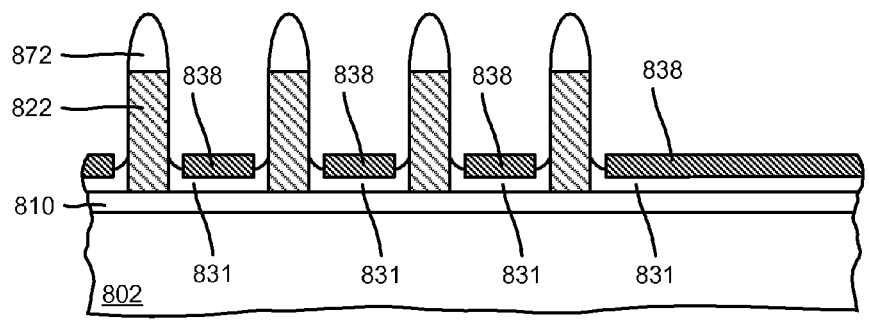
Figure 14G:
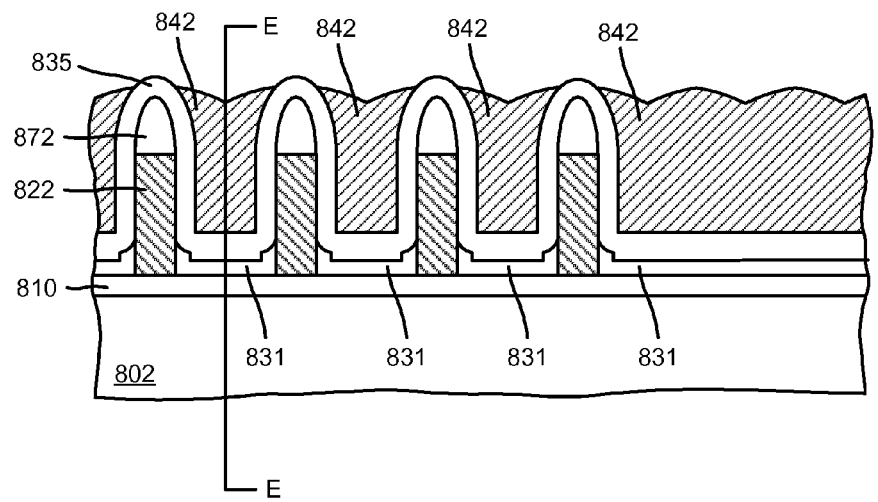
Figure 14H:
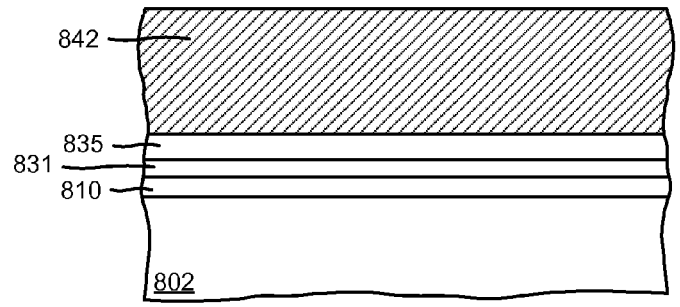
Figure 14I:
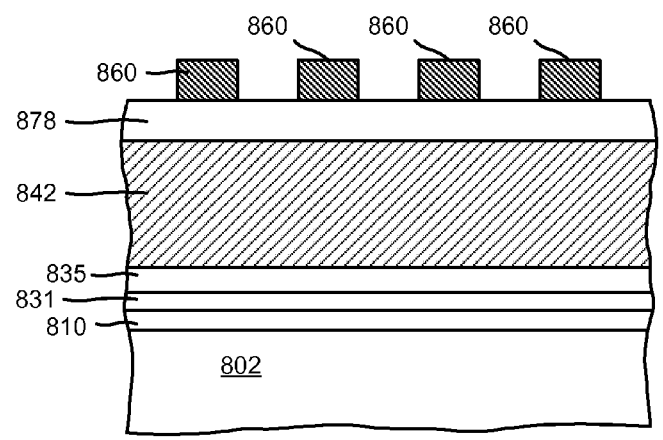
Figure 14J:
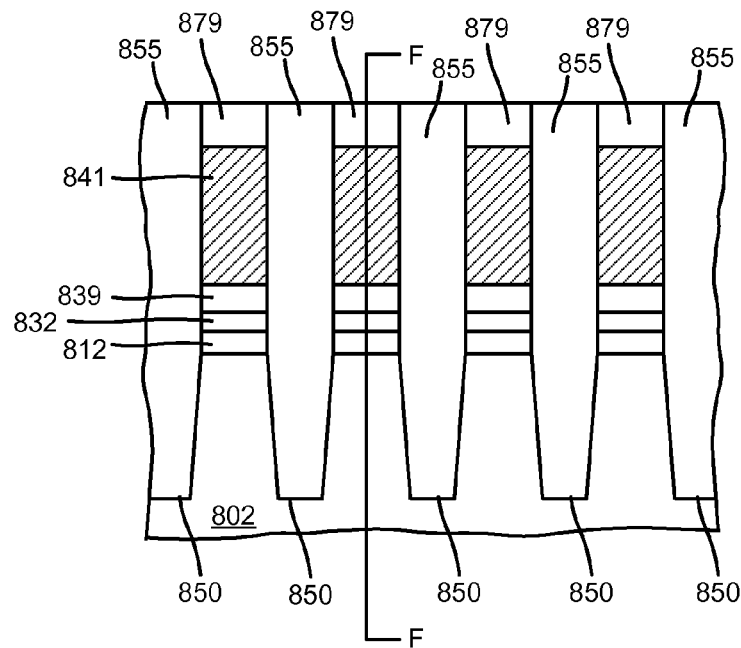
Figure 14K:
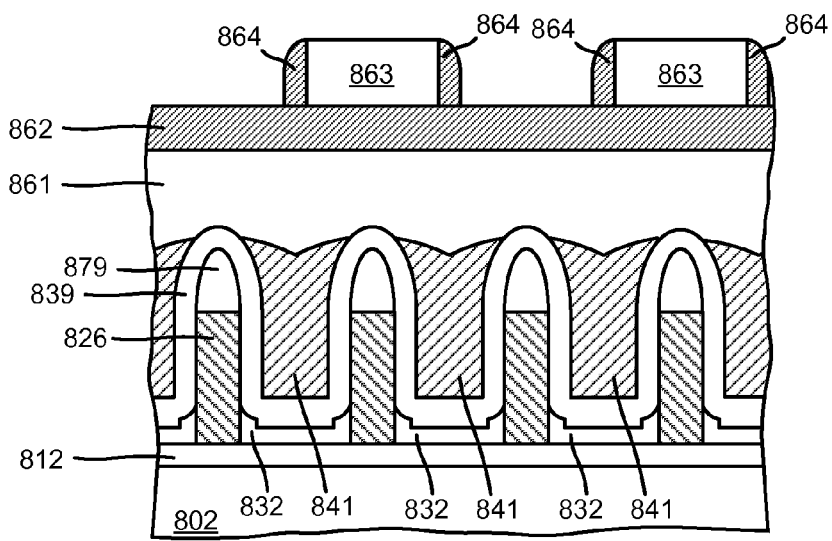
Figure 14L:
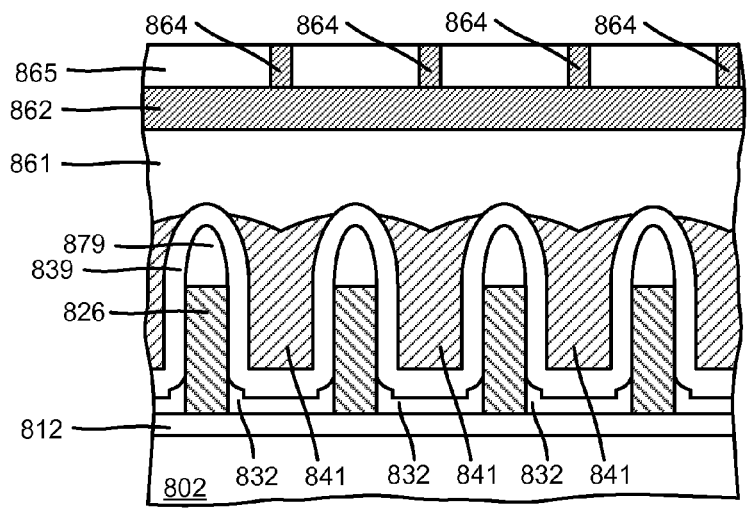
Figure 14M:
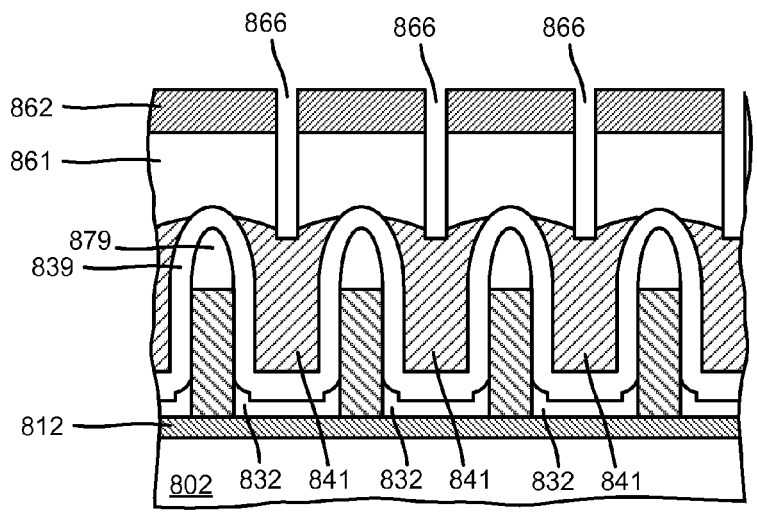
Figure 14N:
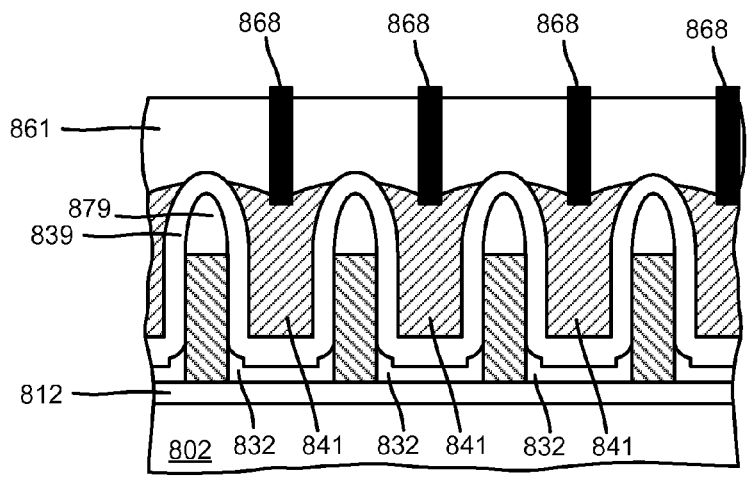

FIGS. 14A-14N are orthogonal cross-sectional views depicting a non-volatile memory array fabricated in accordance with another embodiment. The thickness of the dielectric separating the control gates and substrate surface is again increased, without requiring a corresponding increase in the intermediate dielectric layer separating the control gates and charge storage regions. Isolation between adjacent NAND strings is provided after forming the charge storage structure dimensions in the column direction. Additionally, an additional polishing or etching process is performed to increase the thickness of the dielectric overlaying the surface of the substrate at areas beyond the array.

FIG. 14A is a cross-sectional view taken along a line in the column or NAND string direction through a portion of the string, corresponding to a bit line direction for the memory array. A layer 810 of tunnel dielectric material is formed over the surface of the substrate, followed by a layer 820 of charge storage material (e.g., polysilicon), a hard mask layer 870 (e.g., HTO), and optional assist layer 874 (e.g., polysilicon). A sacrificial layer of oxide has been formed over the assist layer and patterned into a set of sacrificial features 876 elongated across the substrate in the row direction. Polysilicon spacers 882 are formed along the sidewalls of the sacrificial features. Although the disclosed embodiment utilizes a tunnel oxide and polysilicon floating gate material, other materials can be used. Additionally, the hard masking and sacrificial features can be formed of other materials including various nitride, oxide and silicon combinations chosen for their chemical selectivity appropriate for the corresponding process utilized. Additional layers may also be used between one or more of the depicted layers.

In FIG. 14A, a portion of the substrate that is not patterned using the sacrificial features and spacers is also depicted. This area may correspond to an area outside of the array area where peripheral transistors, etc. are to be fabricated. This area may also correspond to an unpatterned area of the array where the select gates are to be formed.

After forming the spacers, the sacrificial features 876 are removed using a chemical wet etch to strip the oxide. FIG. 14B depicts the memory array after removing the sacrificial features and performing a series of etch processes to form strips 822 of polysilicon elongated across the surface of the substrate in the row direction, with the tunnel oxide formed therebetween. Etching also forms strips 872 of the hard mask that are elongated in the row direction over upper surfaces of the strips 822 of polysilicon. FIG. 14B also depicts a second layer 830 of dielectric material that is formed over the exposed portions of the tunnel dielectric layer, and along the sidewalls of the strips of charge storage material. The second layer can include different materials but is a high temperate oxide in one embodiment. Finally, FIG. 14B depicts a protective layer 836 of nitride or other suitable material that is deposited after forming the second layer of dielectric material. During processing of the resulting structures in FIG. 14B, the outlying area has remained unpatterned such that the layer of tunnel dielectric material and the second layer of dielectric material are formed directly thereon, with no intervening layers.

With reference to FIG. 14C, CMP or another suitable process is used to polish or etch the protective layer, resulting in a substantially planar surface of nitride at the memory array region and the outlying area. After planarization, the nitride is anisotropically etched to form protective spacers 838 as depicted in FIG. 14D. Etching recesses the protective layer below the upper surfaces of the second dielectric material that overlies the strips of the hard masking layer. By polishing and then anisotropically etching the planarized nitride surface, the nitride is formed to a substantially uniform depth, both in the memory array region and the outlying region.

An additional etch, such as a hot phosphoric wet etch, is applied to the nitride layer as shown in FIG. 14E. The nitride is recessed well below the upper surface of the strips of polysilicon following the additional etching. Note that the protective layer is formed into a single spacer 838 at the outlying area of the substrate. As demonstrated in FIG. 14B, depositing the protective layer can result in a substantial difference in the depth of the material at the two areas. Directly etching the nitride without polishing as in the first embodiment will remove the nitride layer from the outlying area. By polishing and then anisotropically etching, a uniform layer of the protective material is formed, both in the spaces between strips of the polysilicon and over the tunnel dielectric at the outlying area.

Processing then continues by applying an isotropic etch to remove some or all of the second layer of dielectric material from a portion of each of the strips of polysilicon as shown in FIG. 14F. The spacers 838 protect the underlying dielectric material from etching. The resulting structure includes strips 831 of the second layer of dielectric material elongated in the row direction in the spaces between strips of polysilicon adjacent in the column direction. The strips 831 of the second layer extend in the column direction between adjacent strips of polysilicon and extend vertically (with respect to the substrate surface) along a portion of the opposing sidewalls of adjacent strips of polysilicon. The second layer of dielectric material is also protected at the outlying area of the substrate, resulting in a remaining strip of the second dielectric material after etching. The earlier described embodiment where the protective layer is not polished will not include the second dielectric material at the unpatterned area after etching.

FIG. 14G depicts the substrate after removing the protective spacers 838, forming an intermediate dielectric layer 835 and forming control gates 842 between adjacent strips of the charge storage material with the intermediate dielectric layer therebetween. The intermediate dielectric layer is a triple layer ONO formed by sequentially depositing oxide, nitride and oxide. The intermediate dielectric layer is formed over the strips 831 of the second dielectric material and along the opposing sidewalls of strips 822 of polysilicon adjacent in the column direction. The strips 831 of the second dielectric material are elongated in the row direction and extend vertically along a portion of the sidewalls of the floating gate strips. The intermediate dielectric layer is elongated in the row direction and extends vertically along the portions of the sidewalls of the floating gate strips exposed after etching the second layer of dielectric material. After forming the intermediate dielectric layer, a control gate material is deposited to fill the remaining space between adjacent strips of the charge storage material. The layer of control gate material is etched back to below an upper surface of the intermediate dielectric material. By recessing the control gate material, the layer is separated into strips 842 of the control gate material that are elongated in the row direction between adjacent strips of the charge storage material.

A next series of processes provides electrical isolation between adjacent strings of memory cells by forming isolation trenches elongated in the column direction therebetween. FIG. 14H is a cross-sectional view of the structure, taken along line E-E of FIG. 14G. In this cross-sectional view, tunnel dielectric layer 810 is seen, over which is formed a strip 831 of the second dielectric material, the intermediate layer 835 of dielectric material and a strip 842 of the control gate material. From this view it is seen that the layers remain continuous in the row direction, with etching to define individual active areas not yet performed. Turning to FIG. 14I, a hard masking layer 878 is formed over the strip of control gate material. Strips of photoresist 860 elongated in the column direction are patterned over the hard mask.

With reference to FIG. 14J, the hard masking layer is etched using the photoresist as a mask, followed by etching the control gate material, the second dielectric material, and the tunnel dielectric material until reaching the substrate surface. A compound process can be used for etching the different materials. For example, an oxide/nitride etch is performed to etch the oxide hard mask and expose the polysilicon control gate material. The etch chemistry can be changed to etch the polysilicon and then changed again to etch the intermediate, second and tunnel dielectric layers. Etching results in strips 879 of the hard mask layer 878, individual control gates 841, strips 839 of the intermediate dielectric layer 835, regions 832 formed from the strips 831 of second dielectric material, and strips 812 of the tunnel dielectric region.

After etching to define individual columns of the layer stacks, the substrate is anisotropically etched to a depth in the range of 100 to 300 nm, forming isolation trenches elongated in the column direction between adjacent columns of memory cells. Insulating material 855 is then deposited and polished using CMP to about the upper surface of the resulting strips 879 of the hard masking layer. A thin thermally grown oxide is formed in the trenches, followed by oxide deposition to complete the filling in one embodiment.

Etching to define the active areas and isolation regions divides the control gate material along its length in the row direction, resulting in discontinuity along rows of control gates. Rows of individual control gates can be interconnected to explicitly form word lines for providing common operating voltages to a row of memory cells. A series of processing steps are performed to provide these interconnections. FIG. 14K is an orthogonal cross-sectional view taken along line F-F of FIG. 14J after planarizing the isolation oxide. An oxide hard masking layer 861, e.g. TEOS oxide, is formed over the substrate. An optional assist layer 862 (e.g., polysilicon) is formed over the masking layer, followed by a sacrificial layer of nitride which is patterned using photoresist to form a plurality of sacrificial features 863 elongated in the row direction with spaces therebetween in the column direction. A sacrificial layer of polysilicon is deposited and etched back to form spacers 864 along the sidewalls of the sacrificial features. The sacrificial features are removed using reactive ion etching after forming the spacers.

A layer 865 of insulating material such as another TEOS oxide is then deposited in the spaces between spacers as shown in FIG. 14L. The oxide is planarized to a uniform height with the spacers. After planarizing the surface, etching selective to polysilicon is used to remove the remaining spacer material and underlying assist layer. The etch chemistry is then changed to selectively etch the oxide layer with respect to the polysilicon assist layer until reaching the polysilicon control gates, resulting in the structure depicted in FIG. 14M. Etching forms trenches in the insulating layer to at least the upper surface of the control gates. The trenches are elongated in the in the row direction and are filled with a conductive material 868 to interconnect rows of individual control gates. FIG. 14N depicts the memory array after forming the interconnects and removing the assist layer. The control gate interconnections form the word lines for the array. Polysilicon or various metals can be used for the interconnects.

Figure 15:
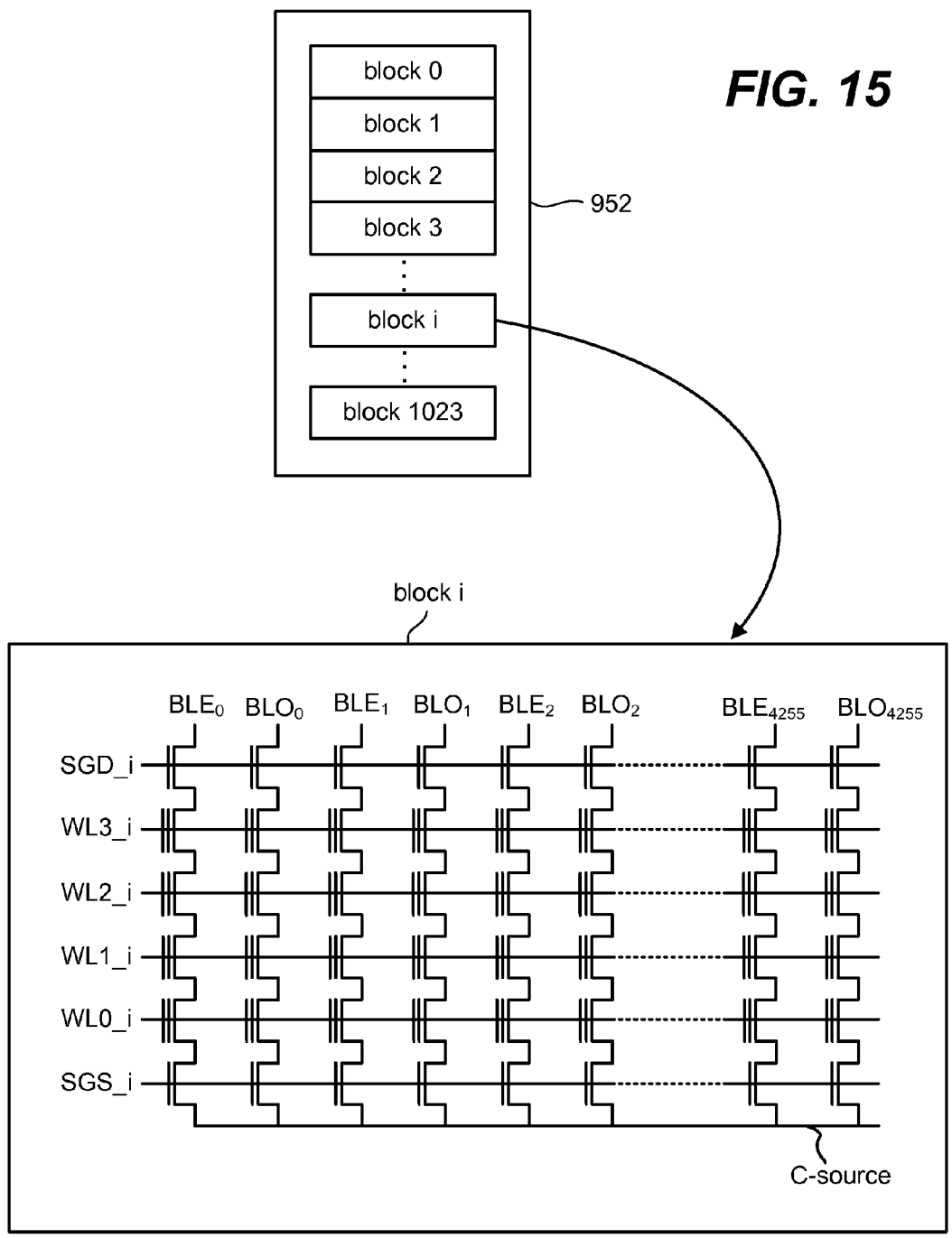
FIG. 15 depicts an exemplary organization of a memory array in accordance with one embodiment.

FIG. 15 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 15 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 16:
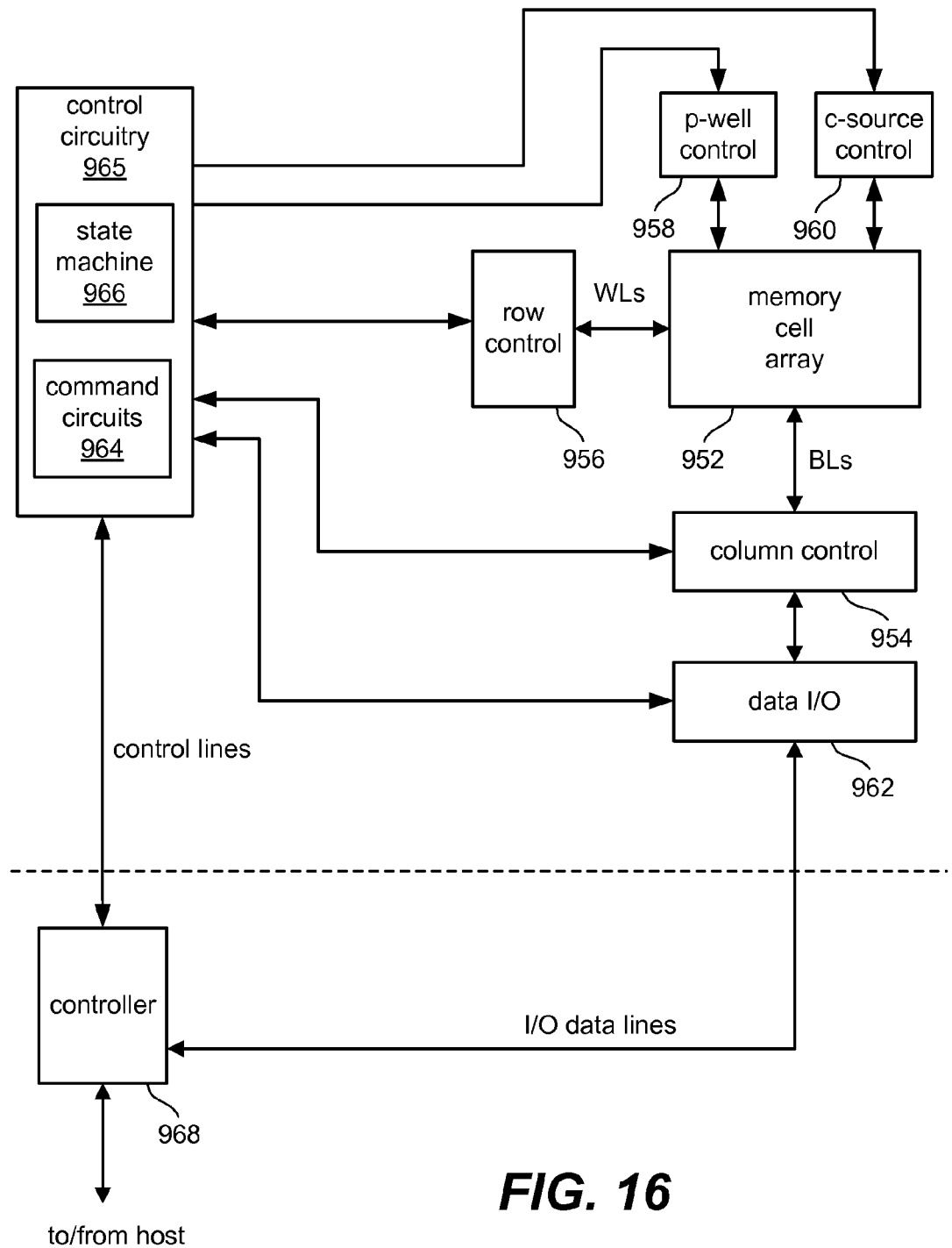
FIG. 16 is a block diagram of an exemplary memory system that can be used to implement embodiments of the disclosed technology.

FIG. 16 is a block diagram of one embodiment of a flash memory system that can be used to implement one or more embodiments of the present disclosure. Other systems and implementations can also be used. Memory cell array 952 is controlled by column control circuit 954, row control circuit 956, c-source control circuit 960 and p-well control circuit 958. Column control circuit 954 is connected to the bit lines of memory cell array 952 for reading data stored in the memory cells, for determining a state of the memory cells during a program operation, and for controlling potential levels of the bit lines to promote or inhibit programming and erasing. Row control circuit 956 is connected to the word lines to select one of the word lines, to apply read voltages, to apply program voltages combined with the bit line potential levels controlled by column control circuit 954, and to apply an erase voltage. C-source control circuit 960 controls a common source line connected to the memory cells. P-well control circuit 958 controls the p-well voltage.

The data stored in the memory cells are read out by the column control circuit 904 and are output to external I/O lines via data input/output buffer 962. Program data to be stored in the memory cells are input to the data input/output buffer 962 via the external I/O lines, and transferred to the column control circuit 954. The external I/O lines are connected to controller 968.

Command data for controlling the flash memory device is input to controller 968. The command data informs the flash memory of what operation is requested. The input command is transferred to state machine 966 which is part of control circuitry 965. State machine 966 controls column control circuit 954, row control circuit 956, c-source control 960, p-well control circuit 958 and data input/output buffer 962. State machine 966 can also output status data of the flash memory such as READY/BUSY or PASS/FAIL.

Controller 968 is connected to or connectable with a host system such as a personal computer, a digital camera, or personal digital assistant, etc. It communicates with the host that initiates commands, such as to store or read data to or from the memory array 952, and provides or receives such data. Controller 968 converts such commands into command signals that can be interpreted and executed by command circuits 964 which are part of control circuitry 965. Command circuits 964 are in communication with state machine 966. Controller 968 typically contains buffer memory for the user data being written to or read from the memory array.

One exemplary memory system comprises one integrated circuit that includes controller 968, and one or more integrated circuit chips that each contain a memory array and associated control, input/output and state machine circuits. There is a trend to integrate the memory arrays and controller circuits of a system together on one or more integrated circuit chips. The memory system may be embedded as part of the host system, or may be included in a memory card (or other package) that is removably inserted into the host systems. Such a card may include the entire memory system (e.g. including the controller) or just the memory array(s) with associated peripheral circuits (with the controller or control function being embedded in the host). Thus, the controller can be embedded in the host or included within the removable memory system.

Various features and techniques are presented with respect to the NAND flash memory architecture. It will be appreciated from the provided disclosure that implementations of the disclosed technology are not so limited. By way of non-limiting example, embodiments in accordance with the present disclosure can provide and be used in the fabrication of a wide range of semiconductor devices, including but not limited to logic arrays, volatile memory arrays including SRAM and DRAM, and non-volatile memory arrays including both the NOR and NAND architecture.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of making a non-volatile memory using a semiconductor substrate, the method comprising:

forming a first layer of dielectric material over a surface of the substrate;

forming a first set of strips of conductive material elongated in a first direction over the surface of the substrate with the first layer of dielectric material therebetween and separated in a second direction with spaces therebetween, the first set of strips including sidewalls extending a first length above the first dielectric layer in a third direction substantially perpendicular to the surface of the substrate, the first direction being substantially perpendicular to the second direction and the third direction;

forming in the spaces between the first set of strips of conductive material a first set of strips of dielectric material elongated in the first direction and extending in the third direction along the sidewalls of the first set of strips a second length above the first layer of dielectric material, the second length being substantially less than the first length such that a substantial portion of the sidewalls of the first set of strips of conductive material remain exposed;

forming a second layer of dielectric material along the exposed portions of the sidewalls of the first set of strips of conductive material and over the first set of strips of dielectric material; and forming a second set of strips of conductive material elongated in the first direction and at least partially occupying the spaces between the first set of strips of conductive material in the second direction, the second set of strips being separated from the first set of strips of conductive material by the second layer of dielectric material and being separated from the surface of the substrate by the first layer of dielectric material, the first set of strips of dielectric material and the second layer of dielectric material.

2. The method of claim 1, wherein:

the first set of strips of conductive material is a first set of individual floating gate regions forming a portion of a NAND string of non-volatile memory cells; and the second set of strips of conductive material is a first set of control gates for the portion of the NAND string of non-volatile memory cells, each non-volatile memory cell including one individual floating gate region and two control gates, the control gates being shared between adjacent floating gate regions.

3. The method of claim 2, wherein the conductive material of the first set of strips and the second set of strips is polysilicon.

4. The method of claim 1, further comprising:
dividing the first set of strips of conductive material along their lengths in the first direction thereby forming a plurality of columns of individual floating gate regions.

5. The method of claim 4, wherein:
dividing the first set of strips of conductive material is performed before forming the first set of strips of dielectric material.

6. The method of claim 4, wherein dividing the first set of strips is performed after forming the second set of strips of conductive material, the method further comprising:
dividing the second set of strips of conductive material along their lengths in the first direction thereby forming from each strip a plurality of control gates separated from one another in the first direction; and
forming a third set of strips of conductive material elongated in the first direction and spaced apart in the second direction, the third set of strips being individually electrically connected to a plurality of control gates from one strip of the second set to thereby form a plurality of word lines.

7. The method of claim 4, wherein dividing the first set of strips includes etching the first set of strips in accordance with a pattern, the method further comprising:
continuing etching in accordance with the pattern by etching the first layer of dielectric material and the substrate to form isolation trenches in the substrate; and
forming an insulating material in the isolation trenches.

8. The method of claim 1, wherein:
forming the first set of strips of dielectric material having a second length being substantially less than the first length of the first set of strips of conductive material thereby exposes a substantial portion of the sidewalls of the first set of strips of conductive material after the first set of strips of dielectric material are formed.

9. The method of claim 1, wherein:
the second layer of dielectric material includes a triple layer of oxide-nitride-oxide.

10. The method of claim 9, wherein masking and etching the second layer of dielectric material includes:
depositing a layer of protective material over the second layer of dielectric material, the protective material at least substantially filling the spaces between the set of charge storage regions;
etching the layer of protective material to form protective spacers over the second layer of dielectric material between charge storage regions, the protective spacers extending in the third direction along a portion of the charge storage region sidewalls; and
etching the second layer of dielectric material using the protective spacers as a mask to thereby remove at least a portion of the second layer of dielectric material from exposed portions of the charge storage region sidewalls.

11. The method of claim 10, further comprising:
planarizing an upper surface of the layer of protective material prior to etching the layer of protective material.

12. The method of claim 11, wherein planarizing includes chemical mechanical planarization.

13. The method of claim 1, wherein:
the first direction is a row direction of an array of non-volatile storage elements of the non-volatile memory; and
the second direction is a column direction of the array of non-volatile storage elements.

14. A method of making non-volatile memory using a semiconductor substrate, comprising:
forming a first layer of dielectric material over a surface of the substrate;
forming a set of charge storage regions over the first layer of dielectric material with spaces between opposing sidewalls of regions adjacent in a second direction substantially perpendicular to a first direction;
forming a second layer of dielectric material extending in the second direction over the first layer of dielectric material between charge storage regions and along the sidewalls of the charge storage regions;
masking and etching the second layer of dielectric material to remove at least a portion of the dielectric material from the sidewalls and form a set of dielectric regions extending in the second direction between charge storage regions;
forming a third layer of dielectric material extending in the second direction over the set of dielectric regions and along the sidewalls of the charge storage regions; and
forming a set of control gates at least partially occupying the spaces between the charge storage regions, the set of control gates being separated from the charge storage regions by the third layer of dielectric material and from the surface of the substrate by the third layer of dielectric material, the second layer of dielectric material and the first layer of dielectric material.

15. The method of claim 14, wherein the second layer of dielectric material is a triple-layer oxide-nitride-oxide.

16. The method of claim 14, wherein:
the set of charge storage regions is a set of conductive floating gate regions formed of polysilicon.

17. The method of claim 14, wherein:
the control gates of the set include upper surfaces continuously elongated across additional sets of charge storage regions intrinsically forming word lines for the non-volatile memory.

18. The method of claim 14, wherein:
the first direction is a row direction of an array of non-volatile storage elements of the non-volatile memory; and
the second direction is a column direction of the array of non-volatile storage elements.

19. A method of fabricating a non-volatile memory array including a plurality of rows and columns of storage elements using a semiconductor substrate, comprising:
forming a first layer of dielectric material over a surface of the substrate;
forming strips of polysilicon elongated in the column direction over the layer of dielectric material with spaces in the row direction therebetween;
forming isolation trenches in the substrate elongated in the column direction between strips of the polysilicon in the row direction;
dividing the strips of polysilicon along their length in the column direction to form columns of floating gates having sidewalls extending in the row direction;
forming sets of dielectric regions for the columns, the dielectric regions of the sets extending in the column direction between opposing sidewalls of adjacent floating gates of the corresponding column, the dielectric regions having a thickness in a third direction substantially vertical to the surface of the substrate, the thickness being substantially less than a thickness of the floating gates in the third direction such that a portion of each sidewall remains exposed;

forming a second layer of dielectric material extending in the column direction over the sets of dielectric regions between adjacent floating gates of the columns and extending in the third direction along exposed portions of the sidewalls of the floating gates; and forming control gates partially occupying the spaces between floating gates in the column direction, the control gates being separated from the sidewalls of the floating gates by the second layer of dielectric material and being separated from the surface of the substrate by the second layer of dielectric material, the set of dielectric regions and the first layer of dielectric materials.

20. A method of making a memory array using a semiconductor substrate, the method comprising:

forming a set of charge storage regions over the substrate with a first layer of dielectric material therebetween, the charge storage regions separated in a second direction with spaces therebetween and including sidewalls extending over the substrate in a first direction substantially perpendicular to the second direction and extending in a third direction substantially perpendicular to the surface of the substrate and the first and second directions;

forming a second layer of dielectric material along the sidewalls of the charge storage regions and over the first layer of dielectric material in the spaces between charge storage regions;

masking the second layer of dielectric material in the spaces between charge storage regions;

etching to remove at least a portion of the second layer of dielectric material along the sidewalls of the charge storage regions, the second layer of dielectric material overlying the first layer of dielectric material in a portion of the spaces between charge storage regions after etching;

forming a third layer of dielectric material along the sidewalls of the charge storage regions and over the second layer of dielectric material in the spaces between charge storage regions; and forming a set of control gates at least partially occupying the spaces between the set of charge storage regions, the set of control gates being separated from the set of charge storage regions by the third layer of dielectric material and being separated from the substrate by the second layer of dielectric material and the first layer of dielectric material.

21. The method of claim 20, wherein:

the first direction is a row direction of the memory array; and the second direction is a column direction of the memory array.

* * * * *